(12) United States Patent
Roberts et al.

(10) Patent No.: US 12,597,912 B1
(45) Date of Patent: Apr. 7, 2026

(54) SYSTEMS AND METHODS FOR GENERATING HIGH VOLTAGE PULSES

(71) Applicant: Radiance Technologies, Inc., Huntsville, AL (US)

(72) Inventors: Zachary Roberts, Phil Campbell, AL (US); Isaac Cohen, Owens Cross Roads, AL (US); Evan Glynn, Madison, AL (US); Aaron King, Huntsville, AL (US); Matthew Heffernan, Huntsville, AL (US)

(73) Assignee: Radiance Technologies, Inc., Huntsville, AL (US)

( * ) Notice: Subject to any disclaimer, the term of this patent is extended or adjusted under 35 U.S.C. 154(b) by 189 days.

(21) Appl. No.: 18/080,136

(22) Filed: Dec. 13, 2022

Related U.S. Application Data

(60) Provisional application No. 63/289,117, filed on Dec. 13, 2021.

(51) Int. Cl.
| | |
|---|---|
| *H03K 3/543* | (2006.01) |
| *H01G 4/04* | (2006.01) |
| *H01G 4/224* | (2006.01) |
| *H01G 4/32* | (2006.01) |

(52) U.S. Cl.
CPC ............... *H03K 3/543* (2013.01); *H01G 4/04* (2013.01); *H01G 4/224* (2013.01); *H01G 4/32* (2013.01)

(58) Field of Classification Search
CPC .................................... H01G 4/32; H03K 3/53
See application file for complete search history.

(56) References Cited

U.S. PATENT DOCUMENTS

| | | | |
|---|---|---|---|
| 3,289,015 A | 11/1966 | Richard et al. | |
| 3,322,976 A * | 5/1967 | Blank ...................... | H03K 3/53 |
| | | | 361/301.5 |
| 4,217,468 A | 8/1980 | Rice et al. | |
| 4,484,085 A | 11/1984 | Fallier, Jr. et al. | |

(Continued)

OTHER PUBLICATIONS

Clothier, "A Fixed Gas-Dielectric Capacitor of High Stability" 1954, all pages (Year: 1954).*

(Continued)

*Primary Examiner* — Daniel C Puentes
(74) *Attorney, Agent, or Firm* — Butler Snow LLP; Jon E. Holland

(57) ABSTRACT

Systems and methods for generating pulses are disclosed. The system can include a unipolar vector inversion generator. The unipolar vector inversion generator can include at least two striplines of a conductive material arranged in a planar spiral configuration that maintain a constant gap between layers of the planar spiral configuration. The system can include a bipolar vector inversion generator. The bipolar vector inversion generator can include a first pair of striplines forming a first unipolar vector inversion generator and a second pair of striplines forming a second unipolar vector inversion generator. The first and second unipolar vector inversion generator can be connected together at respective outer ends of the first and second pair of striplines. A fluid dielectric material can fill the constant gap within the vector inversion generator. A casing can encapsulate the vector inversion generator which can include a hermetically sealed chamber encompassing the vector inversion generator.

23 Claims, 19 Drawing Sheets

(56) References Cited

U.S. PATENT DOCUMENTS

| | | | | | |
|---|---|---|---|---|---|
| 5,159,527 A | * | 10/1992 | Flynn | ...................... | H01B 3/24 |
| | | | | | 361/317 |
| 5,567,995 A | * | 10/1996 | O'Loughlin | ............. | H03K 3/53 |
| | | | | | 307/106 |
| 10,135,364 B2 | | 11/2018 | Roberts et al. | | |
| 2006/0238034 A1 | * | 10/2006 | Rose | ................... | H05K 9/0066 |
| | | | | | 307/106 |

OTHER PUBLICATIONS

Ramrus, A. et al., "High-Voltage Spiral Generators", Maxwell Laboratories, Inc., San Diego, CA 92123, Nov. 1976.

Ruhl, F. et al., "Analysis of the Spiral Generator", Review of Scientific Instrucmkents 51, 1541 (1980), https://pubs.aip.org/aip/rsi/article-abstract/51/11/1541/309712/Analysis-of-the-spiral-generator?redirectedFrom=fulltext.

Yan, J. et al., "Miniature solid-state switched spiral generator for the cost effective, programmable triggering of large scale pulsed power accelerators", Phys. Rev. Accel. Beams 24, 030401—Published Mar. 3, 2021, https://journals.aps.org/prab/abstract/10.1103/PhysRevAccelBeams.24.030401.

Shotts, Z. et al., "Limits and failures modes in High Voltage Vector Inversion Generators", Radiance Technologies, Inc., Published in IEEE Pulsed Power Conference Jun. 1, 2009.

Rose, M. Franklin, "High voltage spiral generators for electric propulsion applications", AIP Conference Proceedings 608, 602 (2002), http://dx.doi.org/10.1063/1.1449778.

Rose, M.F. et al., "High Efficiency Compact High Voltage Vector Inversion Generators", Radiance Technologies, Inc., Jul. 2005, https://www.researchgate.net/publication/224280602_High_Efficiency_Compact_High_Voltage_Vector_Inversion_Generators.

* cited by examiner

| Parameter | Variable | Specification |
|---|---|---|
| Stripline Capacitance | $C_{in}$ | 19.0 – 26.6 nF |
| Output Capacitance | $C_o$ | 387 – 543 pF |
| Output Inductance | $L_o$ | 0.90 – 1.28 µH |
| Output Impedance | $Z_o$ | 48.3 – 48.6 Ω |
| Erection Time | T | 54.4 – 57.5 ns |
| Transit Frequency | $f_t$ | 4.3 – 4.6 MHz |
| Resonant Frequency | $f_r$ | 6.0 – 8.5 MHz |

| Parameter | Value |
|---|---|
| Input Voltage | 5.75 kV |
| Output Voltage | 28.73 kV |
| Efficiency | 62% |
| Transit Frequency | 5.2 MHz |
| Resonant Frequency | 11.8 MHz |

| Parameter | Value |
|---|---|
| Input Voltage | 31.9 kV |
| Output Voltage | 253 kV |
| Efficiency | 72% |
| Transit Frequency | 6.5 MHz |
| Resonant Frequency | 18.5 MHz |

SYSTEMS AND METHODS FOR GENERATING HIGH VOLTAGE PULSES

RELATED APPLICATIONS

This application claims priority to U.S. Provisional Patent Application No. 63/289,117 filed on Dec. 13, 2021, titled "Evaluation of Liquid Dielectrics to Improve Spiral Generator Lifetimes" the entire contents of which are incorporated herein in their entirety.

FIELD OF THE DISCLOSURE

This disclosure generally relates to pulse generators for generating high-voltage pulses, and more particularly to spiral vector inversion generators that use vacuum or fluid dielectric materials to improve generator lifetimes.

RELATED ART

Various high-voltage sources are available to generate high-voltage pulses that are utilized for the operation of high-voltage devices, such as pulse radar, X-ray machines, and the like. A conventional vector inversion generator (VIG) is one such high-voltage source suitable for supplying high voltage pulses to a variety of high-voltage devices. The VIG is structured similar to a two layer spiral wound capacitor and functions as two parallel plate transmission lines sharing a common conductor. The VIG has a capacitance that receives a charge from a voltage source connected to a terminal pair of the VIG and after the capacitor is fully charged, the voltage source is replaced by a short circuit. The short circuit causes, after a time delay, a high-voltage pulse to appear on an output terminal pair of the VIG. The plates of the capacitor function as two transmission lines with the first transmission line (often referred to as the active transmission line) reflecting a time varying electrical field and combining the resulting inverted electric field vector with a relatively slowly decaying electric field on the second transmission line (often referred to as the passive transmission line).

Conventional vector inversion generators are made by winding several layers of a VIG fabric ("fabric") about a circular core in a manner similar to winding ribbon on a cylinder. The circular core may have a variety of diameters and lengths, and the fabric is typically comprised of alternate layers of foil-like conductors such as copper or aluminum and dielectrics such as Mylar or Teflon. The foil-like conductor is preferably shim stock, a type of foil that has consistent dimensions and electrical characteristics. A variety of dielectrics may be used and such dielectrics typically have a relative dielectric constant (permittivity) greater than two.

Most conventional VIGs use a fabric comprised of two alternating layers of conductor and dielectric. Each layer of dielectric is typically comprised of multiple sheets of dielectric material to minimize the chance of breakdown due to pin holes that sometimes occur in a dielectric material. The fabric is usually wound about a cylinder core two to ten or more times. The diameter of the cylindrical core is usually significantly greater than the total thickness of all the layers of the wound fabric. The fabric has a first end, the inside end of the spiral, and a second end, the outside end of the spiral. Two transmission lines are formed by the wound fabric, and the transmission lines have a common conductor. FIGS. 1A and 1B illustrate the wound fabric and the two transmission lines. The dielectric layers between the conductors, as shown in FIG. 1B, form a capacitor that is capable of storing energy in an electric field in accordance with the well-known capacitance energy storage theory.

When a source voltage is applied to a conductor pair at the first end of the conventional VIG, the capacitance of the generator starts to charge and will reach full charge in accordance with the time constants of the charging circuit. Once the generator's capacitor is fully charged, the conventional VIG has energy stored in electric fields of the dielectric materials. The capacitance of the capacitor maybe determined using well-known capacitance equations. The amount of energy stored, $E_{stored}$ may be determined according to Equation (1).

$$E_{stored} = \frac{1}{2} C_T V^2 \tag{1}$$

After the capacitor is fully charged by the source voltage, the source voltage is effectively replaced by a short circuit. The short circuit causes a time varying electric field to propagate from the origin of the short circuit, the first end of the VIG, to the second end or far end of the VIG in accordance with transmission theory. A reflected electrical field wave, from the far end, then returns toward the first end, inverting the polarity of the initial electric field vector. The return wave, when added to the relatively static electrical field of the second transmission line, provides a voltage that, ideally is 2N times the source voltage.

Because the voltage increases by a factor of 2N, the value for the new equivalent capacitance is equal to the previous capacitance divided by $(2N)^2$ thereby satisfying the conservation of energy principle.

Among the shortcomings associated with the conventional VIG are the limitations in their physical design. The fabric dielectric used in the conventional VIG is prone to breakdown and failure through dielectric overstress and heating. Once the dielectric material suffers a breakdown, function of the conventional VIG is reduced or entirely incapacitated.

The embodiments disclosed herein are directed to these and other considerations.

BRIEF DESCRIPTION OF THE DRAWINGS

The present disclosure can be better understood, by way of example only, with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 6 is a table depicting calculated characteristics of an improved unipolar VIG, according to aspects of the present disclosure.

DETAILED DESCRIPTION

Figure 1A:
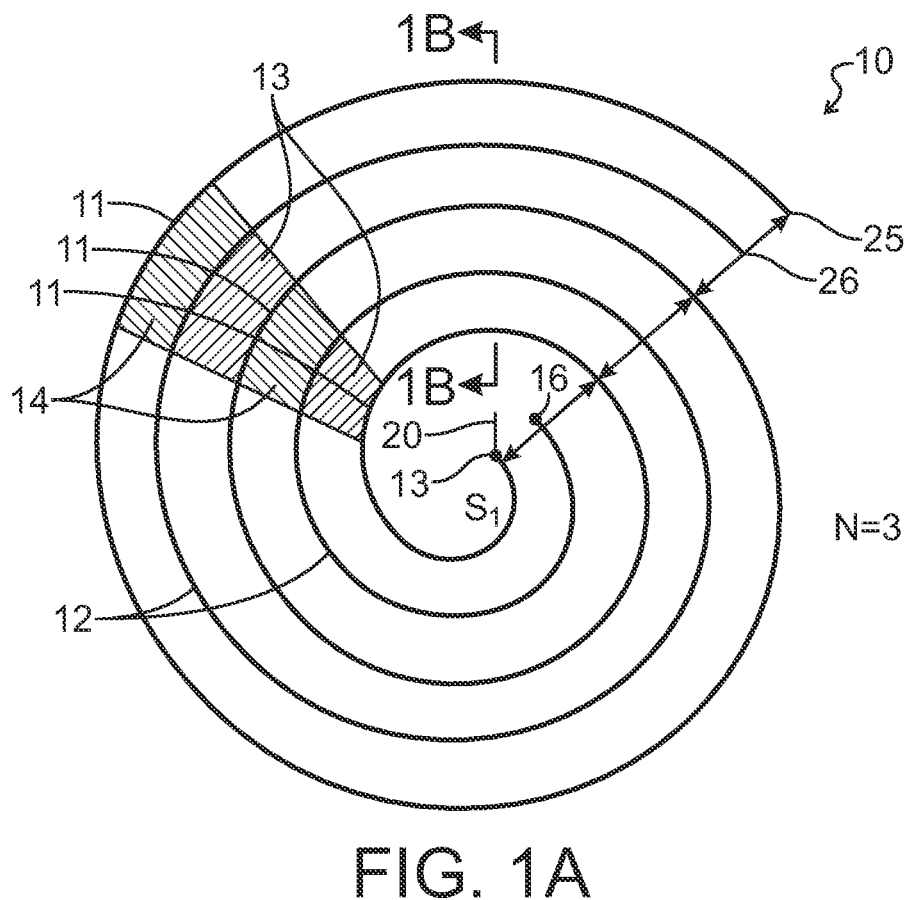
FIG. 1A depicts a conventional VIG as the generator is being charged by a supply voltage, according to aspects of the present disclosure.

In general, the present disclosure generally relates to systems and methods for generating high voltage pulses in accordance with the vector inversion generating principle. In accordance with one exemplary embodiment, a system for generating pulses is disclosed. The system can include a vector inversion generator, and the vector inversion generator can include at least two striplines of a conductive material that are arranged in a planar spiral configuration. Each of the at least two striplines can have a thickness sufficient to maintain a constant gap between respective layers of the planar spiral configuration formed by the at least two striplines. The at least two striplines can be coupled to a shorting switch. The vector inversion generator can include a fluid dielectric material filling the constant gap defined by the at least two striplines.

In another aspect, a system for generating pulses is disclosed. The system can include a vector inversion generator. The vector inversion generator can include at least two striplines of a conductive material arranged in a planar spiral configuration. Each of the at least two striplines can have a thickness sufficient to maintain a constant gap between respective layers of the planar spiral configuration formed by the at least two striplines. The at least two striplines can be selectively coupled to a shorting switch. The vector inversion generator can include a dielectric material filling the constant gap defined by the at least two striplines. The system can include a casing configured to encapsulate the vector inversion generator. The casing can include a plurality of fasteners configured to immobilize the vector inversion generator, and, in some embodiments, a hermetically sealed chamber encompassing the vector inversion generator. The casing can include support plates that surround the vector inversion generator which are connected by support columns of the casing. In some embodiments, the casing can include a plurality of slots within the support plates that can be configured to facilitate the flow of fluid dielectric within the vector inversion generator. In some embodiments, the casing can include a hermetic chamber configured to seal the vector inversion generator from the surrounding environment.

In some embodiments, the dielectric material can be a gas. In other embodiments, the dielectric material can be liquid. In yet other embodiments, the dielectric material can be a vacuum.

In another aspect, a bipolar vector inversion generator is disclosed. The bipolar vector inversion generator can include a first pair of striplines and a second pair of striplines. The first pair of striplines can be constructed of a conductive material arranged in a planar spiral configuration, and be configured to maintain a constant gap between respective layers of the planar spiral configuration formed by the first pair of striplines. The second pair of striplines can be constructed of a conductive material arranged in a planar spiral configuration, and be configured to maintain a constant gap between respective layers of the planar spiral configuration formed by the second pair of striplines. The bipolar vector inversion generator can include a dielectric material filling the constant gap defined by the first pair of striplines and the second pair of striplines. The first pair of striplines can be connected to the second pair of striplines. In some embodiments, one of first pair or the second pair of striplines can be configured to output a positive current, and the respective other pair of striplines can be configured to output a negative current. The bipolar vector inversion generator can include a casing configured to encapsulate the bipolar vector inversion generator. The casing can include first and second charging terminals for charging the bipolar vector inversion generator that are connected to the first and second pair of striplines, respectively. The first and second charging terminals collectively can form a clamping structure configured to stabilize the bipolar vector inversion generator and discourage undesirable current discharge between the striplines. The clamping structure can also act to secure a shorting switch to the striplines that can be configured to activate a discharge of the bipolar vector inversion generator after the bipolar vector inversion generator has been charged to a predetermined input voltage. The casing can include a first high voltage output terminal connected to the first pair of striplines and a second high voltage output terminal connected to the second pair of striplines. The casing can include support plates that surround the bipolar vector inversion generator which are connected by support columns. The casing can include standoffs for spacing the striplines of the first pair of striplines apart and for spacing the second pair of striplines apart in order to prevent undesirable current discharge between the pairs of striplines of the first pair of striplines and the striplines of the second pair of striplines. In some embodiments, the casing includes one or more slots that facilitate the flow of a fluid dielectric through the bipolar vector inversion generator. In some embodiments, the casing includes a hermetic chamber for sealing the bipolar vector inversion generator from the environment.

In another aspect, a method of generating high voltage pulses is provided. In some embodiments, the method can include providing a unipolar vector inversion generator. The unipolar vector inversion generator can include at least two striplines of a conductive material arranged in a planar spiral configuration. Each of the at least two striplines can have a thickness sufficient to maintain a constant gap between respective layers of the planar spiral configuration formed by the at least two striplines. The at least two striplines can be selectively coupled to a shorting switch. The unipolar vector inversion generator can include a dielectric material filling the constant gap defined by the at least two striplines. The unipolar vector inversion generator can include a casing configured to encapsulate the unipolar vector inversion generator. In some embodiments, the method can include providing a bipolar vector inversion generator. The bipolar vector inversion generator can include a first pair of striplines and a second pair of striplines. The first pair of striplines can be constructed of a conductive material arranged in a planar spiral configuration, and be configured to maintain a constant gap between respective layers of the planar spiral configuration formed by the first pair of striplines. The second pair of striplines can be constructed of a conductive material arranged in a planar spiral configuration, and be configured to maintain a constant gap between respective layers of the planar spiral configuration formed by the second pair of striplines. The bipolar vector inversion generator can include a dielectric material filling the constant gap defined by the first pair of striplines and the second pair of striplines. The first pair of striplines can be connected to the second pair of striplines. In some embodiments, one of first pair or the second pair of striplines can be configured to output a positive current, and the respective other pair of striplines can be configured to output a negative current. The bipolar vector inversion generator can include a casing configured to encapsulate the bipolar vector inversion generator.

The method can include charging the vector inversion generator, closing the shorting switch to thereby cause a discharge of the vector inversion generator. In response to the discharge, the method can include causing a breakdown of the dielectric material. The method can include subsequently causing the dielectric material to self-heal.

Unlike conventional VIGs, the disclosed VIGs can utilize non-solid dielectric materials. For example, the disclosed VIGs can utilize a liquid dielectric, a gas dielectric, and/or a vacuum dielectric. The rigid construction that is capable of sustaining a constant gap without a solid dielectric to give support to the structure of the VIG allows for a non-solid dielectric to be utilized. In some examples, a liquid dielectric can be utilized without the disclosed casing. However, the disclosed casing also enables a gas and/or vacuum to be utilized by hermetically sealing the improved VIG within the casing. The improved VIG provides notable advantages over traditional VIGs. For example, the improved VIG is far less susceptible to dielectric breakdown. Even when the improved VIG suffers a dielectric breakdown, the dielectric of the improved VIG is capable of rapidly self-healing, which allows for the continued use of the improved VIG at full capacity, unlike traditional VIGs that once undergoing a dielectric breakdown operate at a greatly reduced capacity or stop functioning altogether.

Discussed herein are fluids having different viscosities and their application as a rapidly self-healing dielectrics. Fluids can have internal friction which must be overcome in order to make the fluid flow. As used herein, "viscosity" may refer to kinematic viscosity. Kinematic viscosity can be understood as an internal friction in a fluid that causes different rates of movement under the force of gravity. Different fluids can have differing kinematic viscosity at least in part due to different fluid densities. In some examples, kinematic viscosity can be determined as a measurement of meters squared per second ($m^2/s$). In measurements of kinematic viscosity, no external force outside of gravity is pushing the fluid. Instead, kinematic viscosity is measured based on the fluid's rate of flow under the influence of its own density.

Figure 1B:
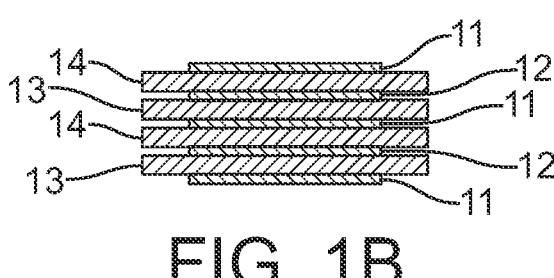
FIG. 1B depicts another view of the conventional VIG as the generator is being charged by a supply voltage, according to aspects of the present disclosure.

FIG. 1A depicts a conventional VIG 10 in a charging state wherein the capacitance of the VIG 10 receives a charge from a voltage source, $V_s$ (not shown). A first conductor 11 and a second conductor 12 are separated by a first dielectric 13 and a second dielectric 14 and the alternating layers are wound around, i.e., rolled about, an essentially circular core, thereby forming a spiral winding of alternating layers of conductors and dielectrics. A section of the layers is shown in FIG. 1B and illustrates the dielectrics 13, 14 between the conductors 11, 12. In a method for fabricating the conventional VIG 10, flexible conductors and dielectrics are unrolled from spools and merged together as layers as a circular core or mandrel of the VIG is rotated. For example, a first spool of copper, aluminum, or other conductor having ribbon-like characteristics (easily wound or unwound from the spool) preferably is used to form the first conductor 11. A second spool (that may be two or more spools of dielectric material in order to minimize the effect of pin holes on breakdown) of Mylar, Teflon, or other dielectric material is preferably used to form the first dielectric 13. Each of the dielectric layers typically are comprised of several sheets of dielectric material. A third spool is preferably used to form the second conductor 12, and a fourth spool (that may be two or more spools of dielectric) is preferably used to form the second dielectric 14. Those having pertinent skill in the relevant art would understand the details of the procedure for winding the layers of material about the circular core.

In some prior art designs, more than two alternating layers of conductors and dielectrics have been utilized. However, for most applications, two layers of conductors and two layers of dielectrics are utilized. The combined layers of materials may be designated as a VIG "fabric" 46. A two-layer fabric 46 includes two alternating layers of two conductors and two dielectrics. The thickness of conductors and dielectrics may vary and depend on a variety of design factors including voltage levels, cost, acceptable energy losses, diameter of the circular core, etc.

Figure 3A:
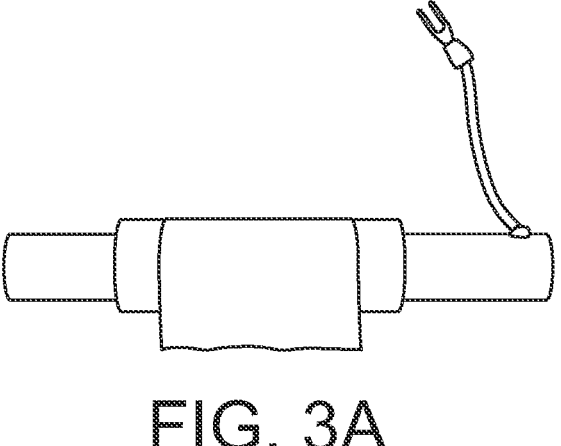
FIG. 3A depicts the design of a conventional VIG, according to aspects of the present disclosure.

For the conventional VIG 10 to have consistent characteristics, the fabric 46 should be wound tightly and uniformly about the circular core. Special purpose winding machines, designed to fabricate spiral wound capacitors, are typically utilized to fabricate the conventional VIG 10. However, for the fabrication of some conventional VIGs, it may be necessary or desirable to have a special machine for winding the fabric 46 about the core. In order to reduce the chance of corona discharge and unwanted contact between the first and second conductors 11, 12, it is desirable for the widths of the dielectrics 13, 14, as seen in FIG. 1B, to be greater than the widths of the conductors thereby providing a protective overlap of dielectrics at the edges. In some VIG fabrications, the edges of the conductors may use edge grading, placing resistive materials on the edges, to eliminate or reduce production of ions. It should be noted that the illustration of FIG. 1A is not to scale so that there is the appearance that the mean (average) diameter of the spiral seems to be approximately one half of the maximum diameter for the conventional VIG 10. For many of the known uses of the conventional VIG 10, the mean diameter is much greater than the total thickness of all the layers of the fabric 46. For example, a typical conventional VIG 10 may have a mean diameter of six inches and have ten or more turns of a fabric 46 such that the total thickness of all the layers of the fabric 46 is less than one quarter of an inch. Hence a typical conventional VIG, from a relative dimensional perspective, may look similar to a short piece of a mailing tube, as shown for example, in FIG. 3A.

The conventional VIG 10 is generally viewed, for analysis and design considerations, as two transmission lines of equal length having a common conductor. One of the transmission lines includes the two conductors 11, 12 separated by the first dielectric 13 and is often referred to as the active transmission line. The active transmission line has one end, shown as inner ends 15, 16 inside the spiral that is connected to a shorting switch 20 shown in an open position in FIG. 1 and in a closed position in FIG. 2. In another embodiment, the shorting switch 20 may be connected to outer ends 25, 26 on the outside of the spiral. The other transmission line includes the two conductors 11, 12 separated by the second dielectric 14 and is often referred to as the passive transmission line. The active transmission line, during operation of the conventional VIG 10, has a time varying electric field vector traveling back and forth between its near end (where the shorting switch 20 is typically located) and its far end as well be described below.

The ratio of the mean diameter, D, to the number of layers of fabric 46 N, is related to the voltage and energy efficiency of the conventional VIG 10. Hence, the value of D/N, sometimes called the diameter-to-turns ratio, is a parameter that is typically considered when designing the conventional VIG 10. The conventional VIG 10 of FIGS. 1A and 2 has a value of N=3. Note that 2 turns of fabric 46 provide 3 layers as seen in FIG. 1A between inner end 15 and outer end 25.

Still referring to FIG. 1A, there is shown the first inner end 15 (inside the spiral) of the first conductor 11 and the second inner end 16 of the second conductor 12. The ends 15, 16 typically have tabs of conductor material extending outwardly for making connections to the VIG 10. The shorting switch 20 of FIG. 1A, shown in the open position, is coupled to the tabs of the two inner ends 15, 16. Also connected to the inner conductors but not shown, is a supply voltage, $V_s$. The supply voltage $V_s$, provides energy for charging the capacitance of the VIG 10. The capacitance of the VIG (capacitor $C_{VIG}$) is formed by the layers of conductors and dielectrics. The directions of the electric field vectors of the fully charged VIG, shown by lines with arrows in FIG. 1A may best be observed by starting at outer ends 25, 26 of the first conductor 11 and the second conductor 12. Additional electric field vector directions may be observed by traversing inward along a radius from outer ends 25, 26 toward the center of the spiral. The electric field vectors as shown in FIG. 1A represent the electric fields on the active transmission line (the vectors pointing inward) and the passive transmission line (the vectors pointing outward) before the shorting switch 20 is closed. Further it should be noted that before the shorting switch is closed, the voltage between the first inner end 15 and the second outer end 26 is equal to the value of the supply voltage, $V_s$. An additional observation shows that the voltage between the first inner end 15 and the first outer end 25 is zero. When the shorting switch 20 is closed, assuming an ideal switch, the voltage across inner ends 15, 16 instantly goes from the value of $V_s$ to zero. In an alternative embodiment, the supply voltage and the shorting switch 20 may be connected across outer ends 25, 26. The alternative embodiment thereby may use terminals 25, 26 as a low voltage input port instead of using inner ends 15, 16. The high-voltage output, for the alternative embodiment, is available across inner end 15 and outer end 25.

Figure 2:
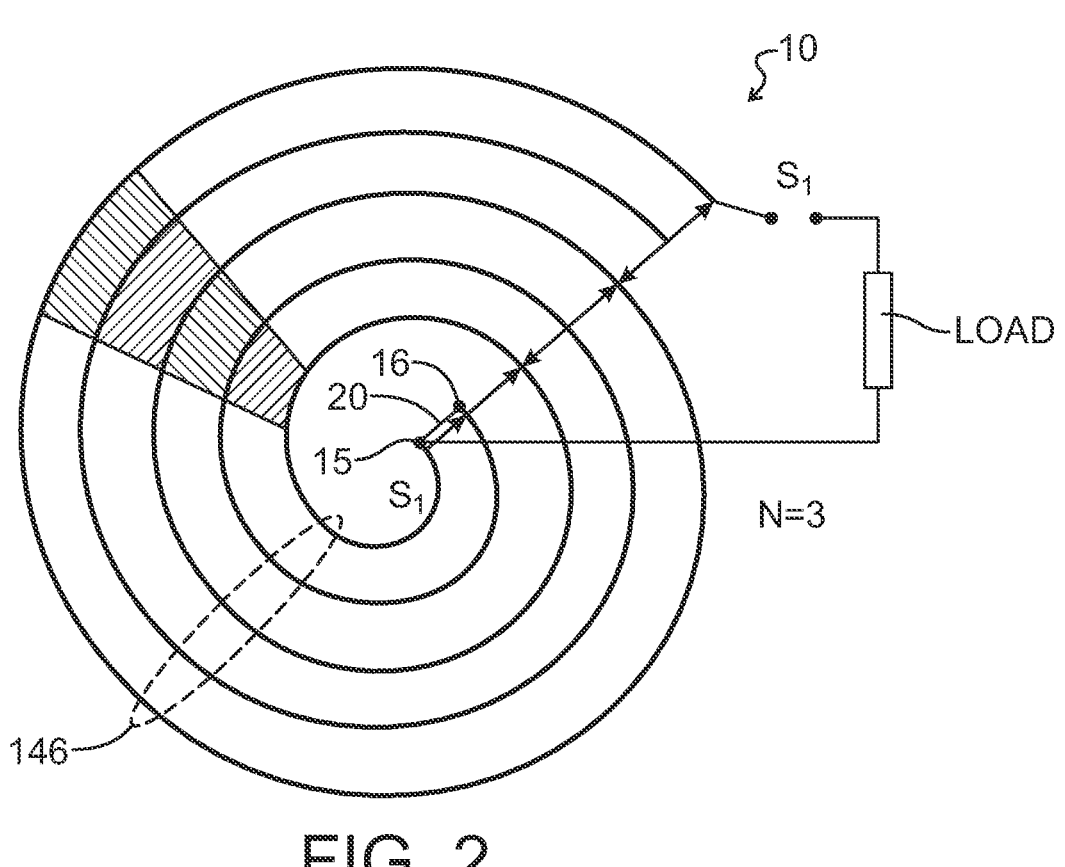
FIG. 2 depicts the conventional VIG of FIGS. 1A and 1B in an output mode of operation and shows a switch for connecting a load to a high voltage output port, according to aspects of the present disclosure.

After the shorting switch 20 is closed connecting inner ends 15 and 16, shown in FIG. 2, a time varying electric field vector travels from inner ends 15, 16 to the outer end 26 and returns. The time varying electric field travels at a phase velocity of around $2(10^8)$ meters per second in accordance to well-known principles of transmission line theory. As the time varying electric field vector is traversing the active transmission line of the conventional VIG 10, electric field polarity is changing and is completely reversed when the wave arrives back at the shorting switch 20. The phase velocity of the inverted vector may be found by dividing the speed of light in free space by the square root of the relative permittivity of the dielectric. The transition time, a round trip time, of the inverted vector is two times the length of the active transmission line divided by the phase velocity of the traveling electric field vector. After the inverted vector has made the out and back trip, the direction of the electrical field along the active transmission line (the line formed by the conductor pair connected across switch 20) has been reversed. Hence a new set of vectors exists on the conventional VIG 10 as shown in FIG. 2. The conventional VIG 10 is now in a fully erected state, shown by the direction of the electrical field vectors, and preferably has a high-voltage pulse available on high-voltage output port of the VIG, i.e., between outer end 25 and inner end 15. If, at this instant, of time, the voltage were measured across the high-voltage port, a theoretical voltage equal to nearly six times the applied voltage may appear. The voltage available at the high-voltage port is a high-voltage pulse and may be applied to a variety of high-voltage devices such as, for example, a pulse-radar antenna, an X-ray tube or other device requiring a high-voltage source for operation. Because there are losses in the conductors 11, 12, dielectrics 13, 14, and the shorting switch of the conventional VIG 10, the voltage efficiency (the ratio of the maximum output voltage to the theoretical output voltage) typically has values between, for example, 20 to 70 percent. Hence, in the typical conventional VIG 10, an applied voltage of 1000 volts may provide a maximum output value of between 1200 and 4200 volts, instead of the theoretical 6000 volts for N=3. Details of design considerations to improve and control efficiency of the conventional VIG 10 are well known to those having pertinent skill in the relevant art and will not be discussed in detail herein. Because the output voltage for conventional VIG 10, theoretically, may increase by a factor of 2N, for energy to be conserved the value of the capacitance for the erected device must be decreased. The erection capacitance, when the output voltage has its maximum value, changes by a factor of $(2N)^2$. For example, the erection capacitor, $C_o$, is one hundredth of the value of $C_{VIG}$, when N=5.

Figure 3B:
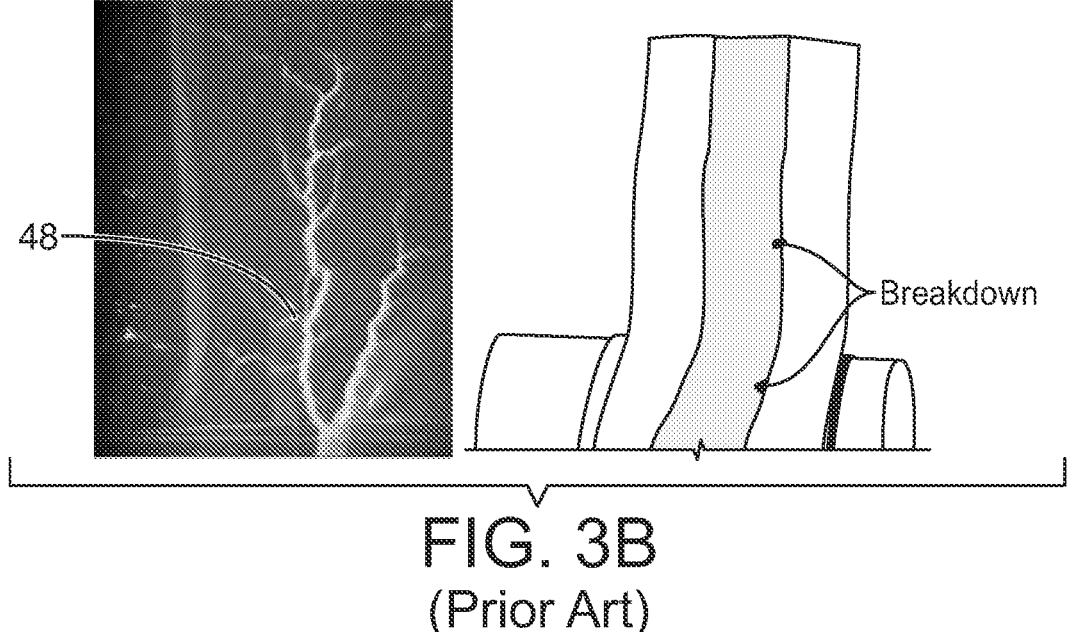
FIG. 3B depicts a failure mode of a conventional VIG, according to aspects of the present disclosure.

FIG. 3B depicts typical failure modes of a conventional VIG 10. Conventional VIG 10 can suffer from reliability issues caused by repetitive high voltage reversals that can cause long-term breakdown and failure of the dielectric materials 13, 14. For example, FIG. 3B shows streamer propagations 48 (left) which can ultimately lead to degradation of dielectric material 13, 14 and over time, can place the conventional VIG 10 into a short circuit configuration. Once conventional VIG 10 suffers a breakdown of dielectric material 13, 14, conventional VIG 10 may be rendered inoperable. Another failure mode of conventional VIG 10 is shown in FIG. 3B (right). Dielectric materials 13, 14 can suffer overstress and heating in conventional VIG 10, leading to hot spots 50 forming in dielectric materials 13, 14. The unipolar VIG 100 and bipolar VIG 1500 as disclosed herein addresses these shortcomings of conventional VIG 10 by being configured to use fluid and vacuum dielectrics which are capable of rapidly self-healing subsequent to a breakdown of a dielectric material within unipolar VIG 100 and/or bipolar VIG 1500. In some embodiments, the dielectrics used in unipolar VIG 100 and/or bipolar VIG 1500 can self-heal in less than approximately 1 second, and in a preferred embodiment, in less than approximately 500 ms.

Figure 4A:
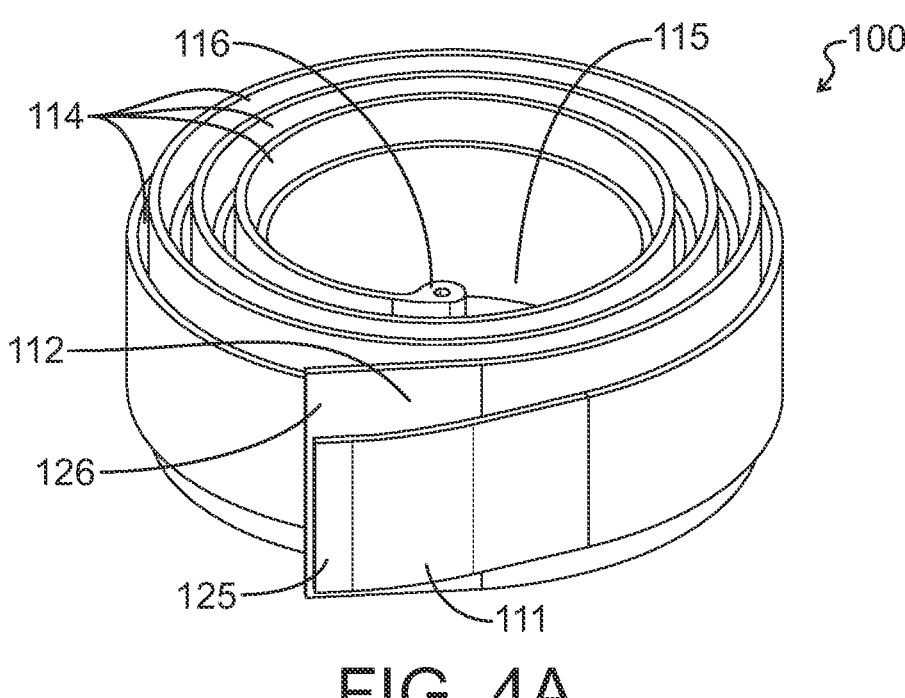
FIG. 4A is an isometric view of an improved unipolar VIG, according to aspects of the present disclosure.
Figure 4B:
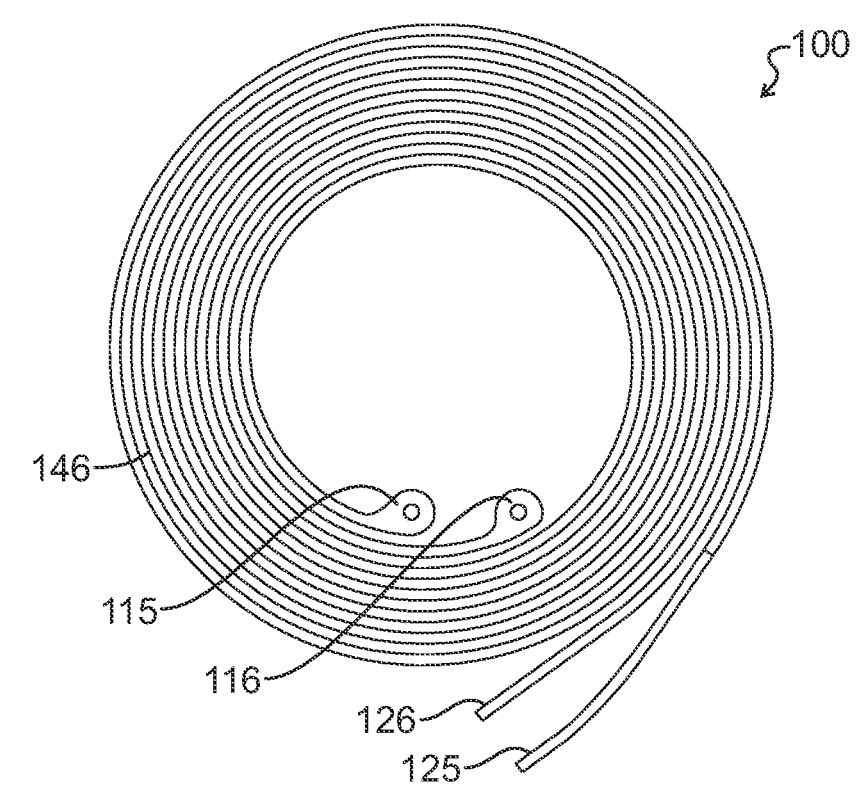
FIG. 4B is a top-down view of an improved unipolar VIG, according to aspects of the present disclosure.
Figure 4C:
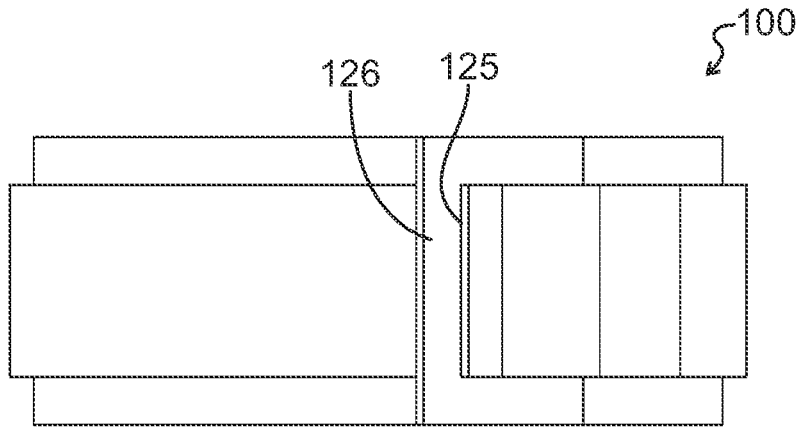
FIG. 4C is a side-profile view of an improved unipolar VIG, according to aspects of the present disclosure.

FIGS. 4A-4C provide various views of an improved unipolar VIG 100. FIG. 4A is an isometric view of an improved unipolar VIG 100. As shown, unipolar VIG 100 has a similar structure to VIG 10. Unipolar VIG 100 includes stripline conductors 111, 112 arranged in a planar spiral configuration and forming inner ends 115, 116 and terminal ends 125, 126. Rather than forming dielectric by wrapping dielectrics 13, 14 around striplines 111, 112 as described with respect to FIGS. 1A-1B and FIG. 2, unipolar VIG 100 is configured to function with a fluid or vacuum dielectric 114. Dielectric 114 is configured to fill the space formed between the spirals formed by striplines 111, 112. While conventional VIG 10 commonly utilizes copper foils that are mechanically secured by layering solid dielectric 13, 14 tightly around the foils, this type of mechanical structure is impossible when utilizing fluid and vacuum dielectrics 114. Without the structural rigidity provided by solid dielectrics 13, 14, conventional VIG 10 can have issues with maintaining a constant gap between striplines 11, 12 during operation. To solve the problem of structural rigidity during operation of the unipolar VIG 100, striplines 111, 112 are made of a thick metal material that is sufficient to provide the rigidity necessary to ensure striplines 111, 112 maintain a constant gap between the spiral windings formed by striplines 111, 112. Materials such as aluminum, copper, and brass can be utilized to construct striplines 111, 112, of sufficient thickness to maintain a constant gap between the spiral windings formed by striplines 111, 112. In some embodiments, the thickness of striplines 111, 112 can be approximately 0.02" to approximately 0.2" in order to maintain a constant gap between the spiral windings formed by striplines 111, 112. Several manufacturing methods can be utilized to form unipolar VIG 100, including but not limited to direct metal laser sintering (DMLS), stereolithography (SLA) resin printing with electroless nickel plating, and wire electrical discharge machining (EDM). In a preferred embodiment, EDM manufacture can be utilized to form unipolar VIG 100. FIG. 4B shows a top-down view of unipolar VIG 100. It can be seen that the spirally wound striplines 111, 112 form layers of conductors 146 that have gaps that are configured to be filled with a fluid and/or vacuum dielectric 114. FIG. 4C shows a side profile view of unipolar VIG 100. As can be seen, according to some embodiments, terminal end 125 can have a smaller width than terminal end 126 to discourage unwanted discharge during operation of unipolar VIG 100.

In some embodiments, unipolar VIG 100 (and bipolar VIG 1500, as described with respect to FIGS. 15A-16C) utilizes fluid dielectric materials 114. Fluid dielectrics can offer numerous advantages. Notably, fluid dielectrics 114 that have a sufficiently low viscosity are capable of rapidly self-healing in the case of dielectric material breakdown during discharge of unipolar VIG 100. The appropriate fluid dielectric 114 can be chosen based on dielectric breakdown strength and secondarily based on kinematic viscosity. In some embodiments, it is envisioned that fluid dielectrics 114 can be capable of rapidly self-healing if they have a kinematic viscosity no greater than approximately $2 \times 10^{-5}$ m²/s. In some embodiments, fluid dielectrics 114 can be capable of rapidly self-healing if they have a kinematic viscosity between approximately $1 \times 10^{-7}$ m²/s to approximately $2 \times 10^{-5}$ m²/s.

Figures 5A, 5B:
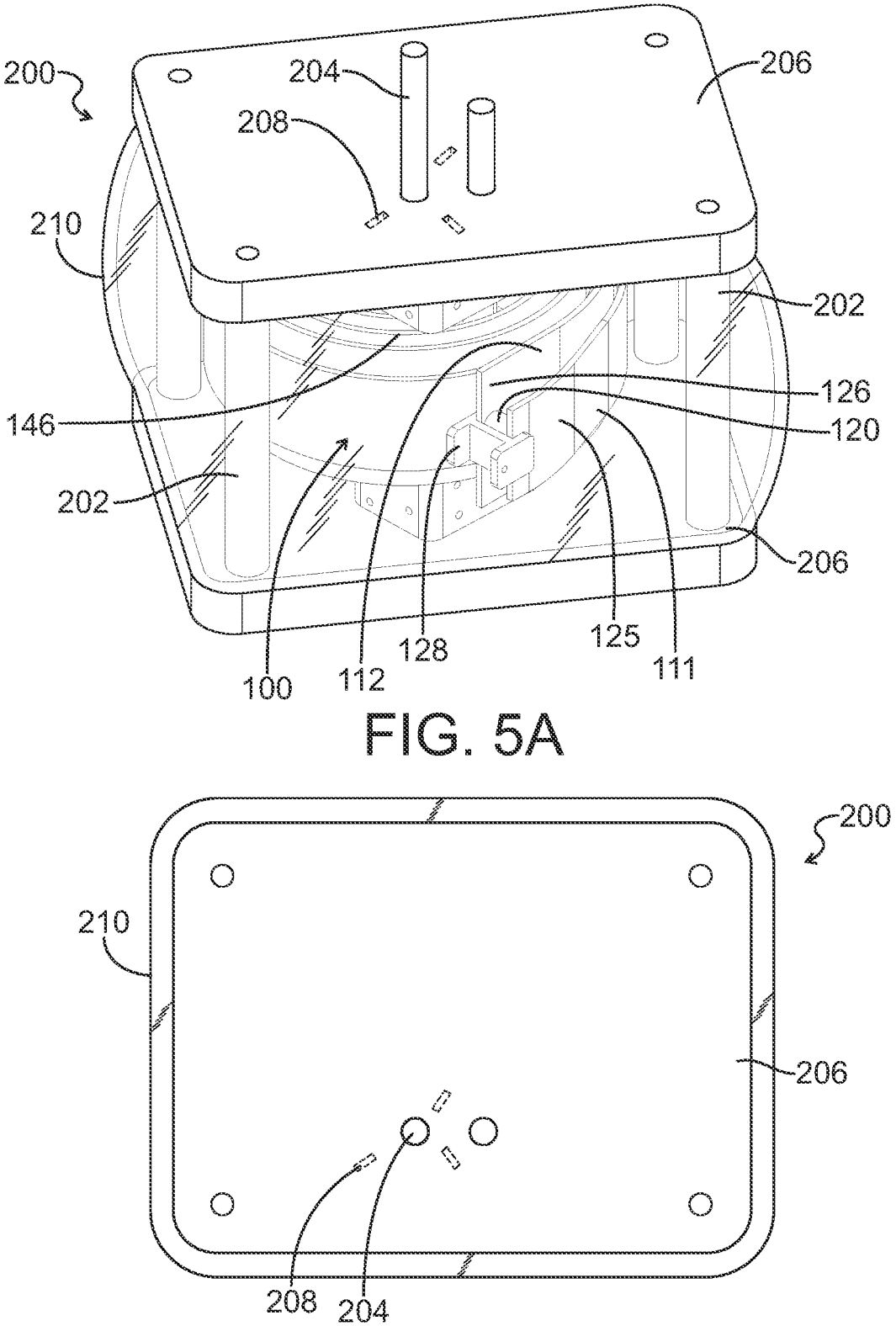
FIG. 5A is an isometric view of an improved unipolar VIG in a casing, according to aspects of the present disclosure.
FIG. 5B is a bottom view of an improved unipolar VIG in a casing, according to aspects of the present disclosure.

FIGS. 5A-5B depict a unipolar VIG 100 fitted into a unipolar VIG casing 200. FIG. 5A shows an isometric view of unipolar VIG 100 and unipolar VIG casing 200, while FIG. 5B shows a bottom perspective view of unipolar VIG 100 and unipolar VIG casing 200. Unipolar VIG casing 200 is configured to keep striplines 111, 112 of unipolar VIG 100 from moving during charging and discharging of the unipolar VIG 100. Keeping VIG 100 secure during operation is important because small movements of the striplines can cause damage to the striplines or cause an unintended discharge if, for example, the distance between the striplines 111, 112 (e.g., the distance between the layers of conductors 146) is reduced during charging or discharging of the unipolar VIG 100. As shown, unipolar VIG casing 200 can include support plates 206 that are connected by columns 202. Support plates 206 and columns 202 keep VIG 100 fastened and prevent undesirable movement during operation of the VIG 100. Columns 202 can be fastened to the support plates 206 using fasteners known in the art, including but not limited to screws, bolts, etc. High voltage output 204 can be connected to the high voltage end of the striplines 111, 112 (e.g., inner ends 115, 125) of the unipolar VIG 100 and can provide the high voltage output to a desired apparatus (not shown). Unipolar VIG casing 200 can include a clamping structure 128 which can be used to further immobilize the terminal ends 125, 126 that can be used to charge the unipolar VIG 100 to a predetermined voltage. Clamping structure 128 can also house shorting switch 120 that is disposed between outer ends 125, 126, of striplines 111, 112. In some embodiments, the unipolar VIG casing 200 can include a plurality of slots 208 that can be disposed in either or both of support plates 206. The slots 208 can be configured to facilitate the flow of a liquid dielectric 114 when a liquid dielectric is utilized with unipolar VIG 100. That is, unipolar VIG casing 200 and unipolar VIG 100 can be placed into a container of dielectric liquid 114 when in use and the slots 208 can allow the liquid dielectric 114 to rapidly flow through the unipolar VIG 100, which can facilitate the ability of the dielectric to rapidly self-heal when an unwanted discharge occurs. When a gas dielectric or vacuum dielectric 114 is utilized, slots may not be present within unipolar VIG casing 200. Rather, unipolar VIG casing 200 can include a hermetic chamber 210 that completely encompasses unipolar VIG 100 and provides a hermetically sealed chamber that can contain gas dielectric 114 within the gaps of the striplines 111, 112 of unipolar VIG 100 (e.g., between the layers of conductors 146). Alternatively, when a vacuum dielectric 114 is used, the hermetic chamber 210 allows the vacuum dielectric 114 to be maintained within unipolar VIG 100.

FIG. 6 is a table depicting calculated characteristics of an improved unipolar VIG. The electrical parameters of unipolar VIG 100 were calculated primarily through traditional spiral generator equations. The stripline 111, 112 (e.g., input) capacitance can be given according to Equation (2):

$$C_{in} = \epsilon_r \epsilon_0 \frac{\pi D w}{d} 2N \qquad (2)$$

In Equation (2), D stands for the average diameter of the spiral of unipolar VIG 100, d is the dielectric thickness, $\epsilon_r$ is the relative static permittivity constant (e.g., dielectric constant), $\epsilon_0$ is the vacuum permittivity constant, w is the width of the stripline, and N is the number of windings of the spiral of unipolar VIG 100. Because of the effect of the voltage reversals is to put the capacitance of each turn of unipolar VIG 100 in series across the output rather than in parallel across the input, the output capacitance can be given by Equation (3):

$$C_o = \epsilon_r \epsilon_0 \frac{\pi D w}{2Nd} \qquad (3)$$

The Ruhl and Herziger model used a simple output inductance formula that was not accurate for calculating characteristics of unipolar VIG 100, so Grover's calculation was used instead. The output waveform of the unipolar VIG 100 is dominated by two frequencies, typically described as effects of a "slow wave" and a "fast wave" of unipolar VIG 100. The "slow wave" is driven by the resonant behavior of the capacitive and inductive natures of two spirals formed by striplines 111, 112 wrapped around one another. The frequency of the "slow wave" is given by Equation (4):

$$f_r = \frac{1}{2\pi \sqrt{L_0 C_0}}. \qquad (4)$$

In Equation (4), $L_o$ stands for output inductance, and $C_o$ stands for output capacitance. The "fast wave" is driven by the transit of the wave down striplines 111, 112 and back to erect a high-voltage pulse. The transmit time of a spiral generator from one end to the other and back can be given by Equation (5):

$$T = \frac{2N\pi D \sqrt{\epsilon_r}}{c} \qquad (5)$$

Since the rise time is a quarter of the period of a sinusoidal signal, the transit frequency can be given by Equation (6):

$$f_t = \frac{1}{4T} \qquad (6)$$

Although the Equations (2)-(6) are discussed with respect to unipolar VIG 100, these equations are also applicable to the bipolar VIG 1500, introduced with respect to FIGS. 15A-16C below. In some embodiments of unipolar VIG 100 and bipolar VIG 1500, the frequency associated with the "slow wave" can be higher than the frequency associated with the "fast wave." To relieve the confusion brought about by this nomenclature, we will use the terms "resonant frequency" and "transit frequency" to discuss these two major components of the output waveform, $f_r$ and $f_t$, respectively.

In some embodiments, unipolar VIG 100 is capable of producing an output between approximately 40 kV and approximately 300 kV. In some embodiments, bipolar VIG 1500 is capable of producing approximately 250 kV. In some embodiments, bipolar VIG 1500 is capable of producing approximately 300 kV. In some embodiments, bipolar VIG 1500 is capable of producing between approximately 300 kV to approximately 1,000 kV.

The measured dimensions of an example unipolar VIG 100, along with their variances, were used to calculate ranges for the electrical parameters shown in FIG. 6. For reference, the measured dimensions of example unipolar VIG 100 are given below in Table 1, although in practice these parameters and subsequent calculated characteristics of FIG. 6 can vary.

| Design Parameter | Design | Measured |
|---|---|---|
| Stripline Thickness | 0.032" | 0.034" |
| Dielectric Gap Min | 0.032" | 0.009" |
| Dielectric Gap Max | 0.032" | 0.079" |
| Inner Diameter | 1.00" | 1.02" |

Figure 7A:
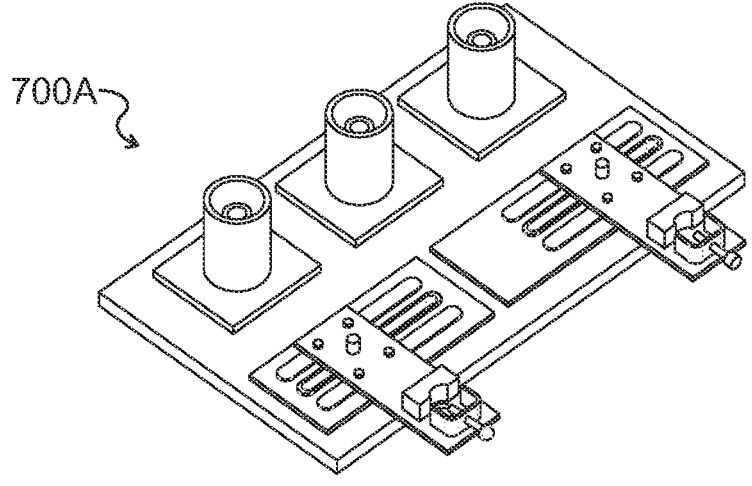
FIG. 7A depicts a custom PCB used to measure the output inductance of an improved unipolar VIG, according to aspects of the present disclosure.
Figure 7B:
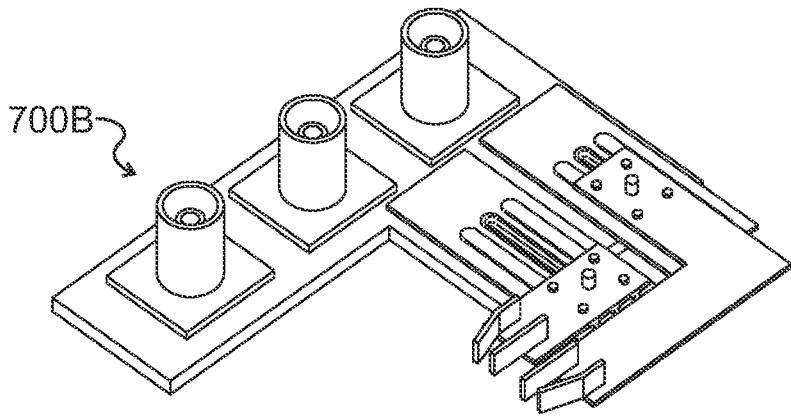
FIG. 7B depicts a custom PCB used to measure the output capacitance and output impedance of an improved unipolar VIG, according to aspects of the present disclosure.
Figure 8A:
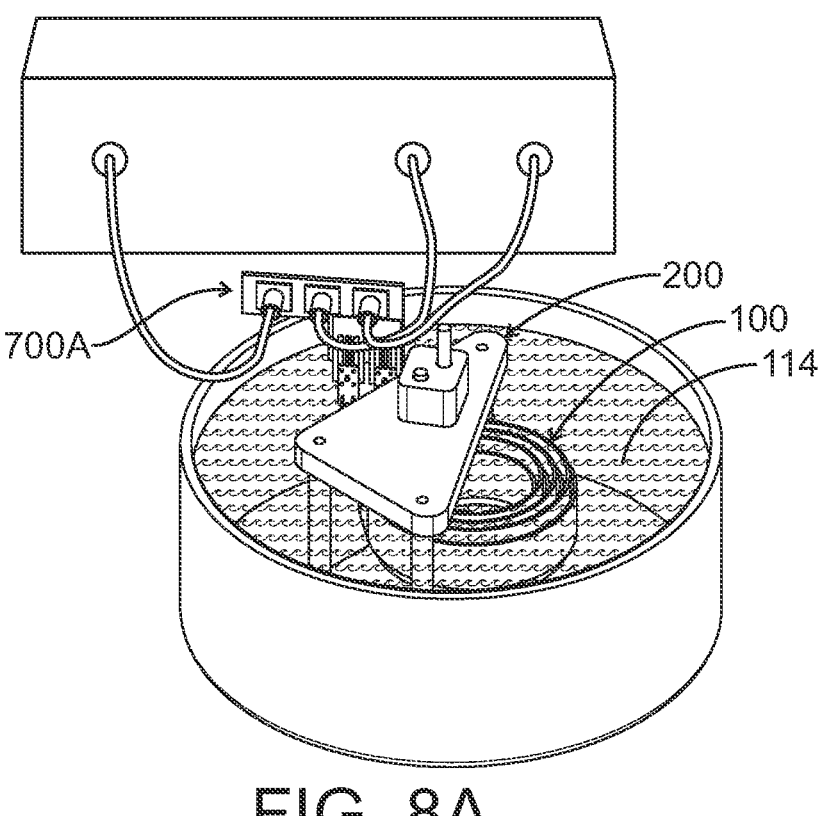
FIG. 8A depicts an experimental setup used to measure output inductance of an improved unipolar VIG, according to aspects of the present disclosure.
Figure 8B:
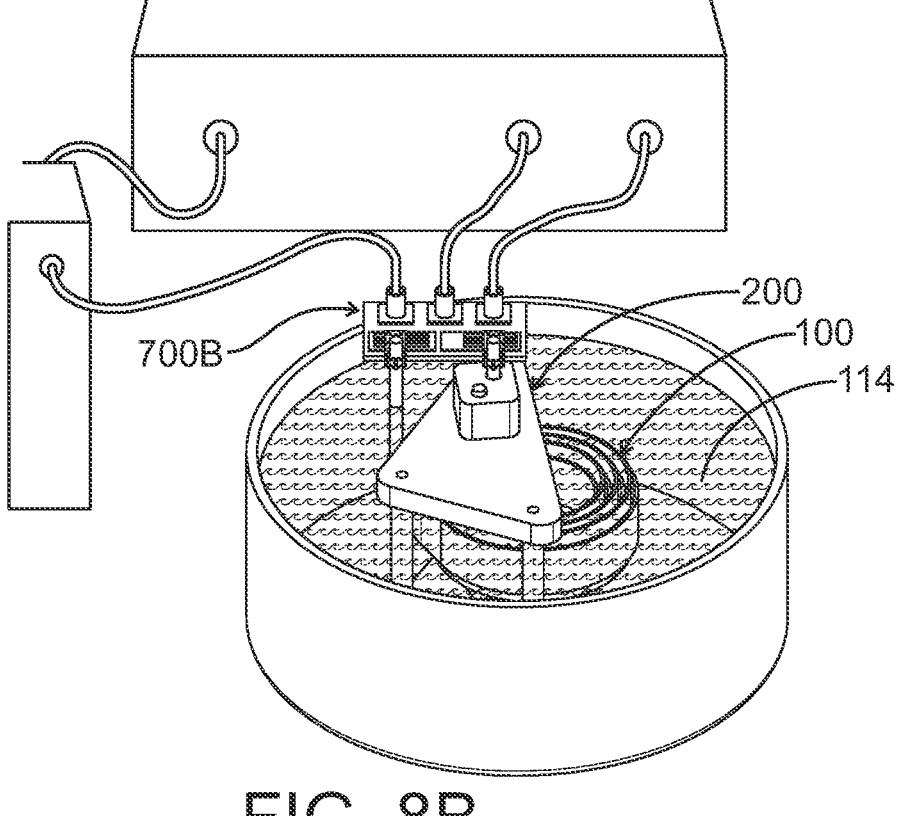
FIG. 8B depicts an experimental setup used to measure output capacitance and output impedance of an improved unipolar VIG, according to aspects of the present disclosure.

FIGS. 7A-7B depict custom PCBs 700A, 700B that can be used to measure output inductance (FIG. 7A), capacitance (FIG. 7B) and impedance (FIG. 7B) of unipolar VIG 100. As shown in FIGS. 8A, the inductance of unipolar VIG 100 can be measured by connecting PCB 700A to unipolar VIG 100, for example by connecting electrical clamps from PCB 700A to inner end 115 and terminal end 125 of VIG 100. Capacitance and impedance can similarly be measured by connecting PCB 700B to unipolar VIG 100 as shown in FIB. 8B, for example by connecting electrical clamps from PCB 700B to inner end 115 and terminal end 125 of VIG 100.

Figure 9:
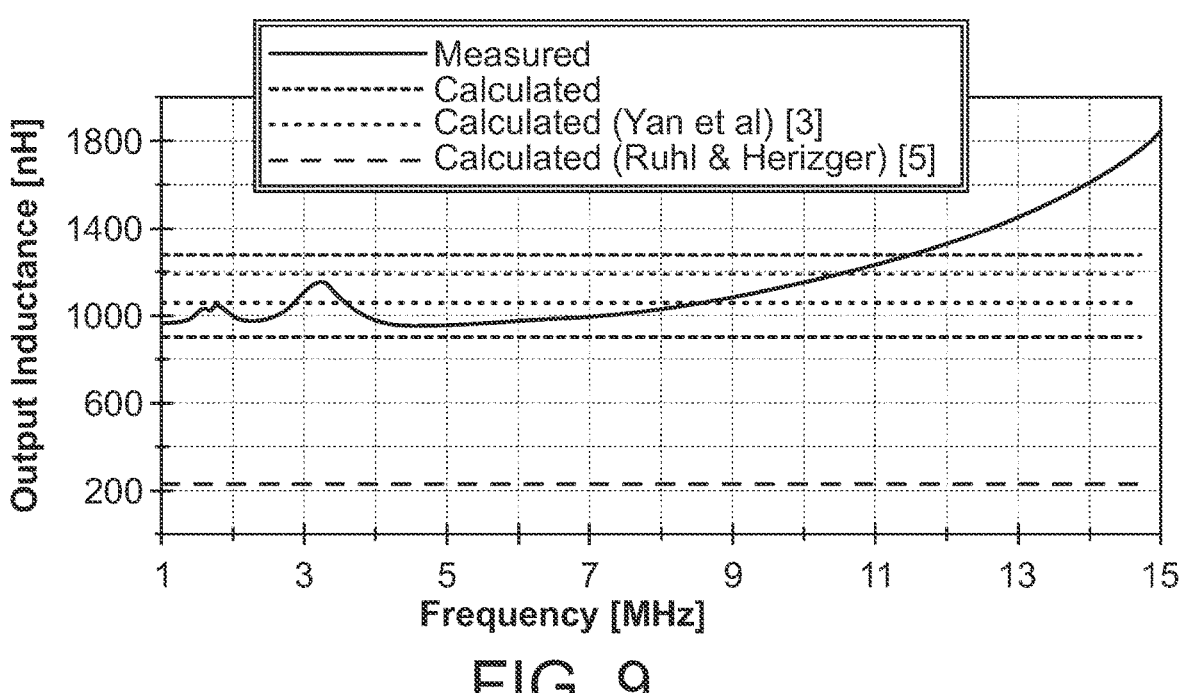
FIG. 9 depicts the measured output inductance of an improved unipolar VIG, according to aspects of the present disclosure.

FIG. 9 depicts the measured output inductance of unipolar VIG 100 versus the calculated output inductance according to Grover, Yan, and Ruhl & Herziger. As can be seen in FIG. 9, the calculated output inductance according to the Ruhl & Herziger formulation was not accurate for unipolar VIG 100. See F. Rühl and G. Herziger. (1980). *Analysis of the spiral generator*. Review of Scientific Instruments 51, 1541. However, the calculated inductance according to the Grover formulation and the Yan formulation were fairly close to the measured characteristics of unipolar VIG 100 from a frequency of approximately 1 megahertz to approximately 12 megahertz. See Grover, F. W. (2004). *Inductance Calculations: Working Formulas and Tables*. Courier Corporation.

See also Yan, J., et al. (2021). *An Investigation Into High-Voltage Spiral Generators Utilizing Thyristor Input Switches*. IEEE Transactions on Power Electronics 36:9, 10005, 10019.

Figure 10:
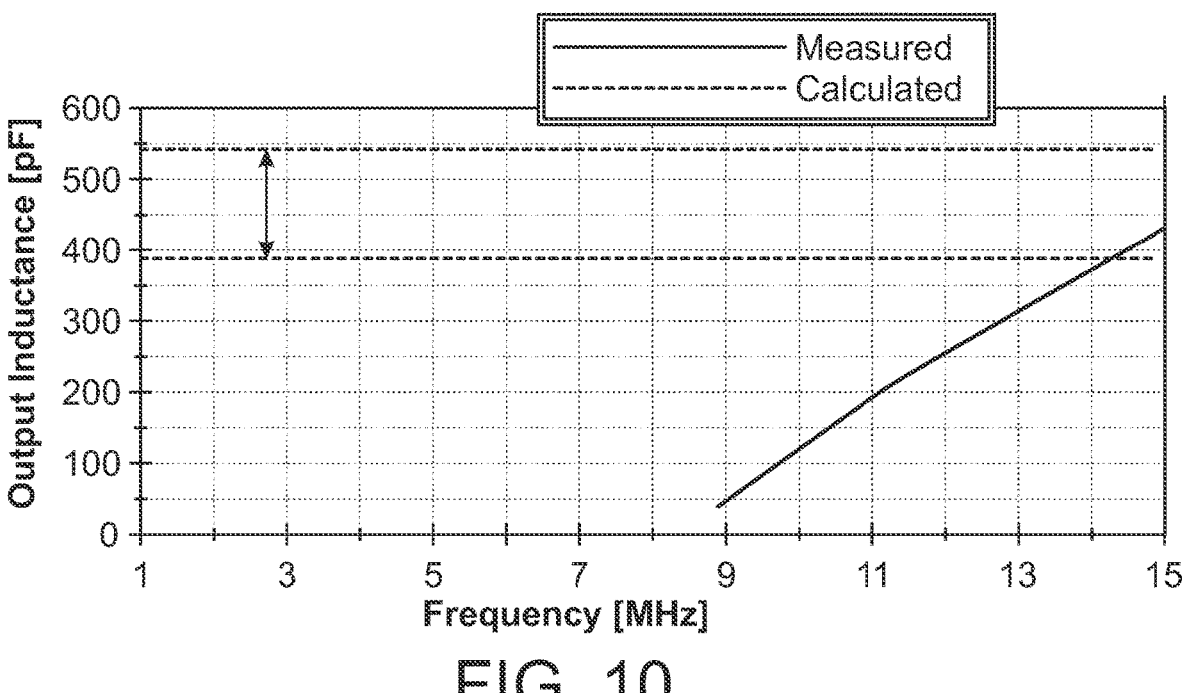
FIG. 10 depicts the measured output capacitance of an improved unipolar VIG, according to aspects of the present disclosure.

FIG. 10 depicts the measured output capacitance of the unipolar VIG 100 as compared to the calculated output capacitance. As shown in FIG. 10, the output impedance of unipolar VIG 100 can vary significantly from 9 megahertz to 15 megahertz, suggesting that a single capacitance does not appropriately model the output capacitance of unipolar VIG 100 as a function of frequency, and an improved circuit model for unipolar VIG 100 could more accurately predict the frequency dependence of the output inductance parameter.

Figure 11:
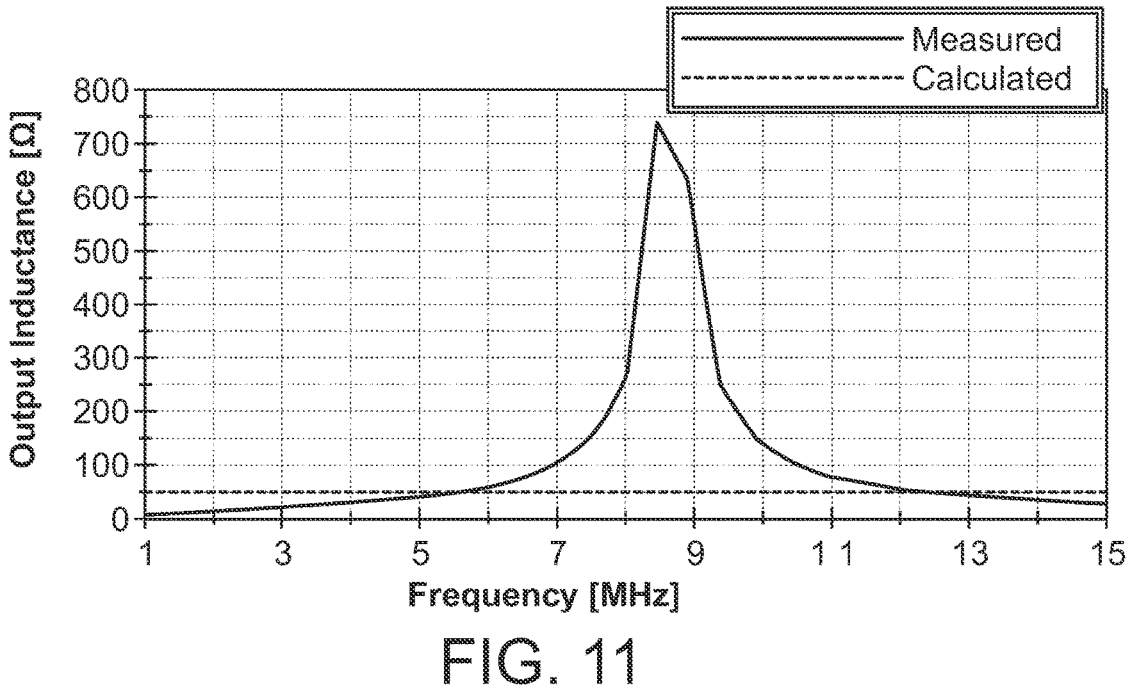
FIG. 11 depicts the output impedance of an improved unipolar VIG, according to aspects of the present disclosure.

FIG. 11 depicts the output impedance of the unipolar VIG 100 versus the calculated output impedance. In some embodiments, the output impedance of the unipolar VIG 100 can have a resonance just below 9 megahertz. It should be noted that the output impedance can closely match the calculated output impedance at the desired transit frequency $f_t$. It should additionally be noted that conventional VIGS 10 also exhibit similar characteristic resonance, and have output impedances that closely match the calculated output impedance at the desired transit frequency, $f_t$ which shows that unipolar VIG 100 (and bipolar VIG 1500, as described below) are suitable replacements for conventional VIGS 10 which utilize solid layers of dielectrics.

Figure 12:
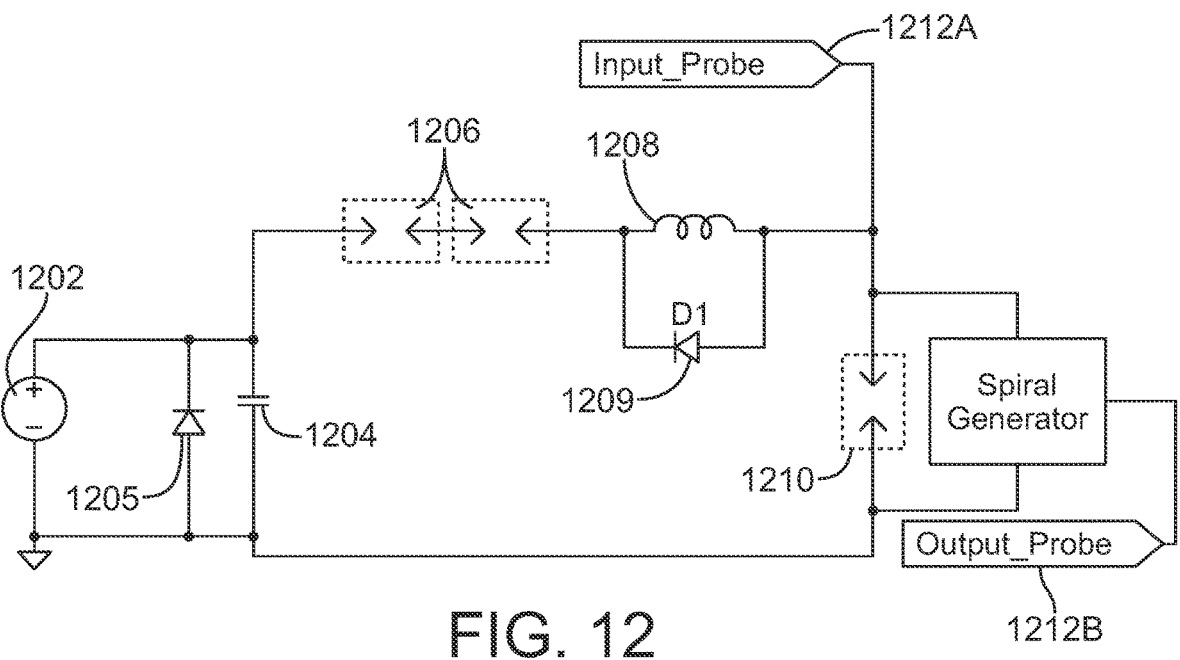
FIG. 12 depicts an experimental setup for high voltage testing of an improved unipolar VIG, according to aspects of the present disclosure.

FIG. 12 depicts an experimental setup schematic for high voltage testing of a unipolar VIG 100 with a liquid dielectric 114. It should be noted that a similar experimental setup can be utilized for testing the bipolar VIG 1500. Note that the specific components used herein are exemplary only, and can be interchanged with different components in various embodiments consistent with the present disclosure. As shown, power supply 1202 can be used to charge capacitor 1204 to a predetermined voltage. In some embodiments, the predetermined voltage can be approximately 15 kV. In some embodiments, the predetermined input voltage can be approximately 30 kV, while in yet other embodiments, the input voltage can be approximately 125 kV. After reaching the predetermined voltage, a gas discharge tube 1206 can break down and can impulse and impulse charge the unipolar VIG 100 through an air-core inductor 1208. In some embodiments, impulse charging is necessary depending on the type of liquid dielectric 114 used. For example, when utilizing deionized water as a dielectric 114, impulse charging may be necessary because deionized water can behave capacitively at higher frequencies and resistively at lower frequencies. This means that certain dielectrics, such as DI water may act resistively under DC charging, which may call for impulse charging. Both capacitor 1204 and inductor 1208 may use parallel diodes 1205, 1209 to prevent voltage and current reversals during operation. The input of the unipolar VIG 100 can be driven gas discharge tube 1210. Input probe 1212A and output probe 1212B can be attached at the inner end 115 and terminal end 125 to measure the impulse characteristics of unipolar VIG 100 and/or bipolar VIG 1500, including input voltage and output voltage upon discharge of VIG 100 and/or VIG 1500. When a dielectric 114 is used that does not behave resistively at lower frequencies, for example, when using a perfluorinated compound (e.g., Fluorinert™) as the dielectric material 114, the charging setup can be simplified because it is not necessary to impulse charge the VIG 100 or the VIG 1500. Instead, such dielectric materials allow for DC charging. In this case, the capacitor 1204, diode 1205, gas discharge tube(s) 1206, inductor 1208, diode 1209, and gas discharge tube 1210 can be removed, and the VIG 100/VIG 1500 can be directly connected to the power supply 1202 until VIG 100/VIG 1500 is charged to a predetermined input voltage.

Figures 13, 14:
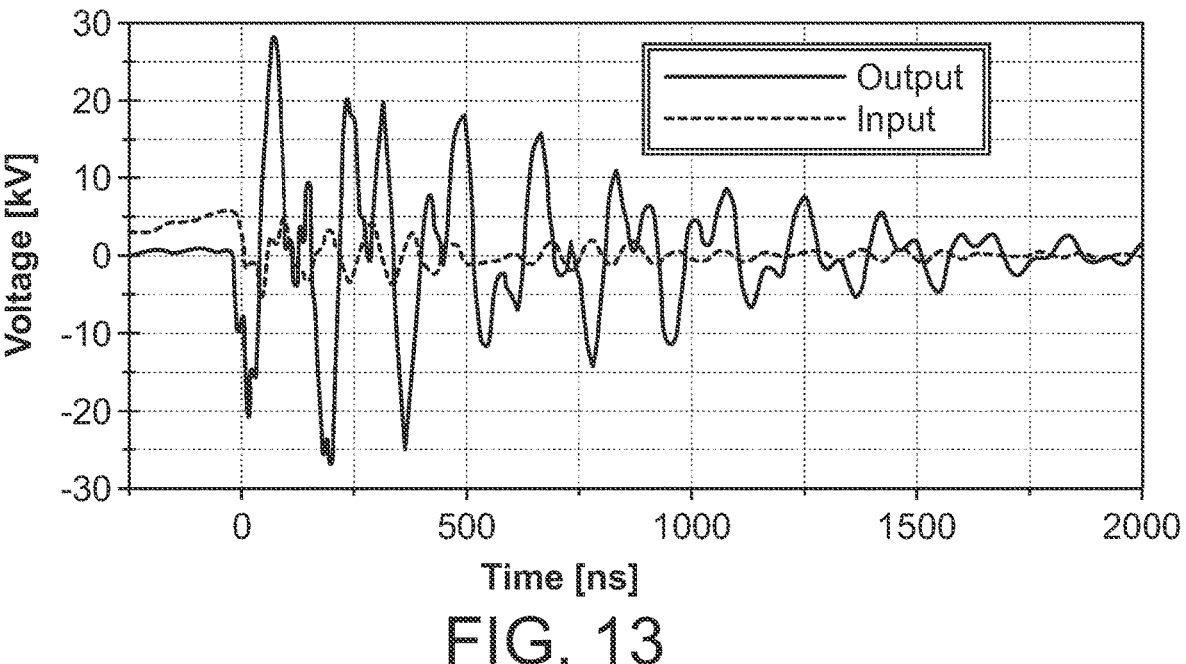
FIG. 13 depicts output voltage as a function of time for an improved unipolar VIG, according to aspects of the present disclosure.
FIG. 14 is a table depicting output waveform parameters for an improved unipolar VIG, according to aspects of the present disclosure.

FIG. 13 depicts output voltage as a function of time for a unipolar VIG 100. In the exemplary embodiment, the unipolar VIG 100 achieved 28.73 kV, but in other embodiments, unipolar VIG 100 can be configured to output between approximately 40 kV to 300 kV. The output voltage of unipolar VIG 100 can be dependent on a plurality of factors, including but not limited to the selection of dielectric 114, the number of windings, materials, and widths of striplines 111, 112 of unipolar VIG 100, the input voltage applied to unipolar VIG 100, and the inner and outer diameters of unipolar VIG 100. Depending on the type of dielectric used (e.g., if using DI water as dielectric 114), the various components used to charge unipolar VIG 100, such as power supply 1202, capacitor 1204, gas discharge tube 1206, air-core inductor 1208, and gas discharge tube 1210 can influence the output voltage of unipolar VIG 100 by influencing the predetermined input voltage that VIG 100 is charged to.

FIG. 14 is a table depicting output waveform parameters for a unipolar VIG 100, according to aspects of the present disclosure. The example unipolar VIG 100 can deliver an output voltage of 28.73 kV from an input voltage of 5.75 kV. The efficiency of unipolar VIG 100 in the exemplary embodiment was approximately 62%. The measured transit frequency and resonant frequency, $f_t$ and $f_r$, respectively, were measured to be 5.2 megahertz and 11.8 megahertz. It should be noted that the parameters shown in FIG. 14 are merely exemplary, and can be varied depending on the plurality of factors mentioned above.

Figure 15A:
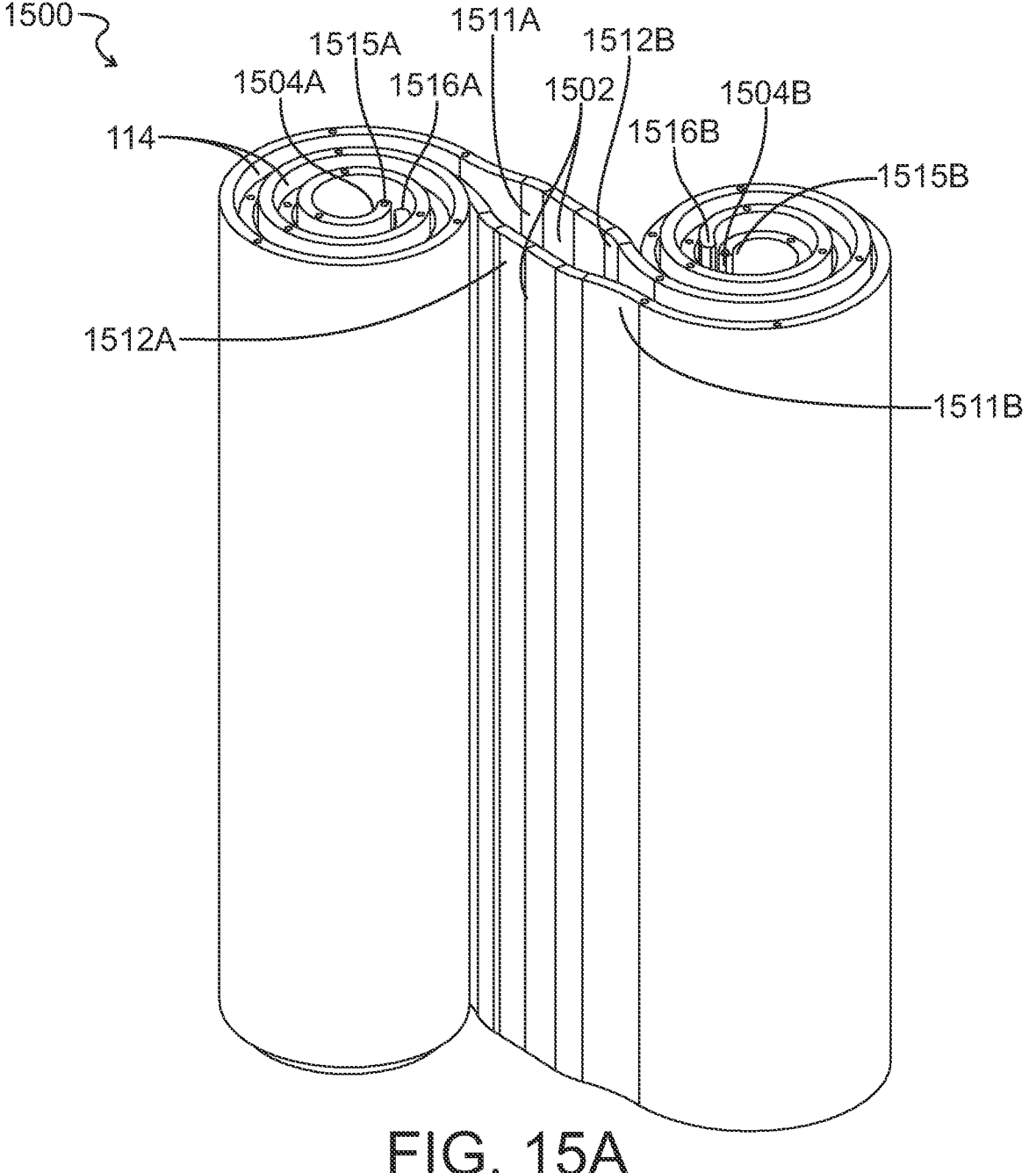
FIG. 15A depicts an isometric view of an improved bipolar VIG, according to aspects of the present disclosure.
Figure 15B:
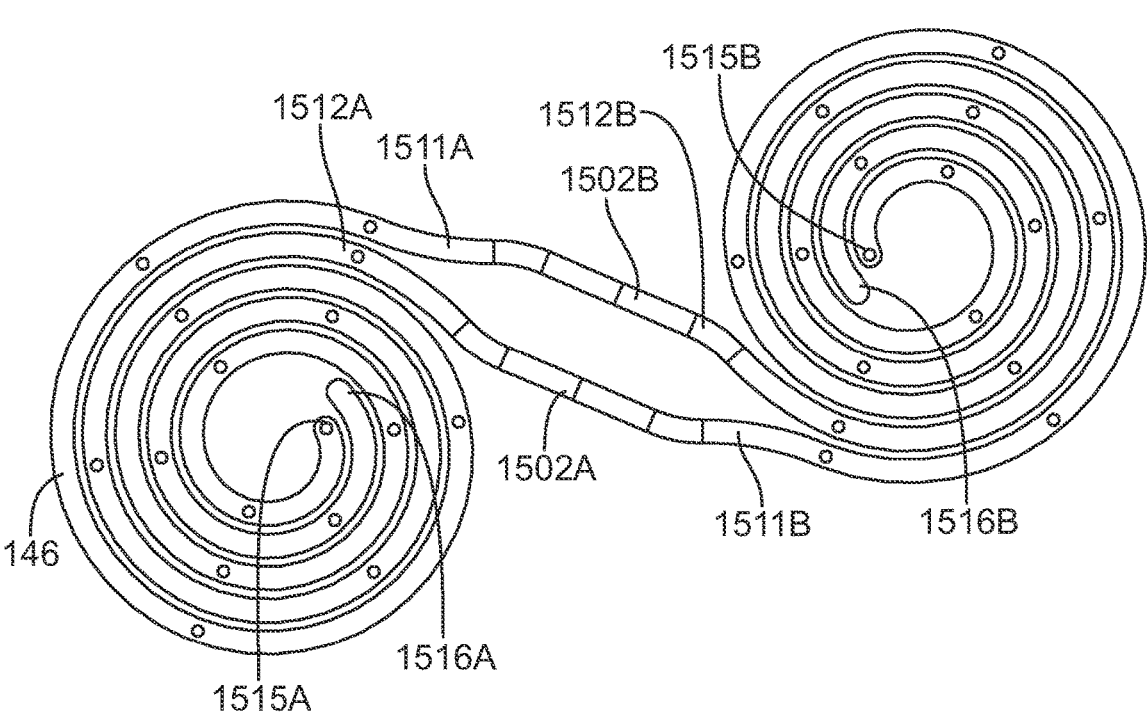
FIG. 15B depicts a top-down view of an improved bipolar VIG, according to aspects of the present disclosure.
Figure 15C:
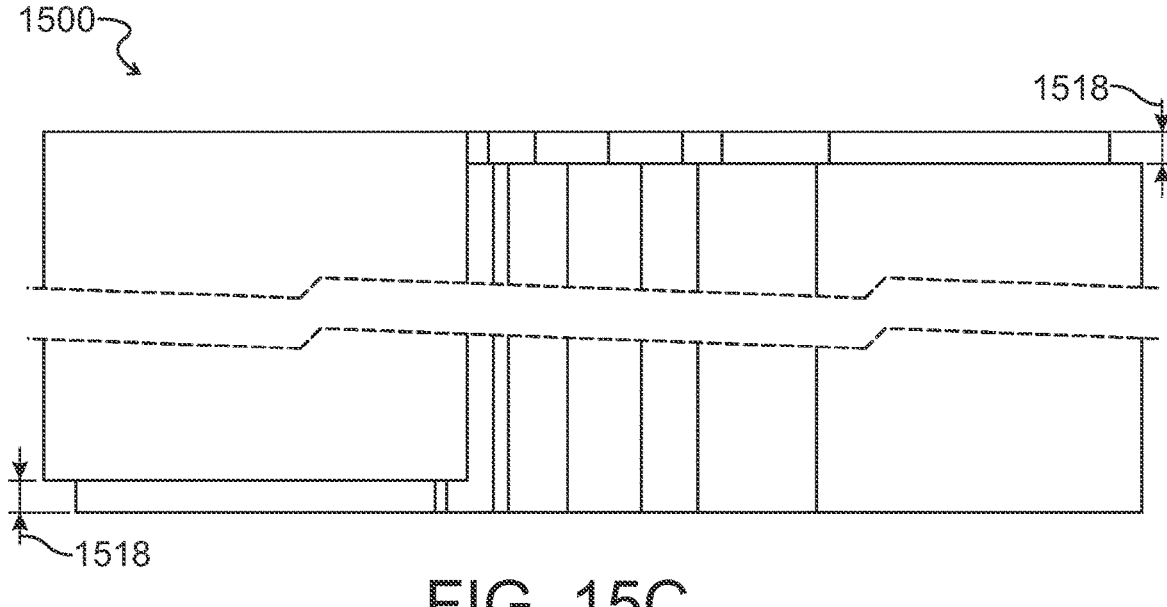
FIG. 15C depicts a side-profile view of an improved bipolar VIG, according to aspects of the present disclosure.

FIGS. 15A-15C depict a bipolar VIG 1500. More specifically, FIG. 15A is an isometric view of bipolar VIG 1500, FIG. 15B is a top profile view of bipolar VIG 1500, and FIG. 15C is a cross-sectional view of the striplines of bipolar VIG 1500. As shown in FIG. 15A, bipolar VIG 1500 can be constructed similarly to two unipolar VIGs 100 mated together at their respective outer ends. As shown, the bipolar VIG 1500 can include a first pair of striplines 1511A, 1512A and a second pair of striplines 1511B, 1512B. The stripline 1511A of the first pair of striplines can be joined to stripline 1512B of the second pair of striplines. The stripline 1512A of the first pair of striplines can similarly be joined to stripline 1511B of the second pair of striplines. Where the striplines 1511A and 1512B connect and 1512A and 1511B connect the bipolar VIG 1500 can have input charging plates 1502, which are used to charge the bipolar VIG 1500 to a predetermined input voltage. Both the first pair of striplines and the second pair of striplines can be constructed of a conductive material arranged in a planar spiral configuration. Both the first pair of striplines 1511A, 1512A, and the second pair of striplines 1511B, 1512B can be configured to maintain a constant gap between respective layers of the planar spiral configuration formed by the respective pair of striplines. The first pair of striplines can have inner ends 1515A, 1516A, and the second pair of striplines can have inner ends 1515B, 1516B. The inner ends 1515, 1516 can be configured to supply the high voltage output of the bipolar VIG 1500. Notably, the striplines of both the first pair of striplines 1511A, 1512A and the second pair of striplines 1511B, 1512B can be offset from one another by offset distance 1518, as best seen in FIG. 15C. Rather than forming dielectric by wrapping dielectrics 13, 14 around striplines 11, 112 as described with respect to FIGS. 1A-1B and FIG. 2, bipolar VIG 1500 is configured to function with a fluid or vacuum dielectric 114. Dielectric 114 is configured to fill the space formed between the spirals formed by striplines 1511 and 1512. While conventional VIG 10 commonly utilizes copper foils that are mechanically secured by layering solid dielectric 13, 14 tightly around the foils, this type of mechanical structure is impossible when utilizing fluid and vacuum dielectrics 114. Without the structural rigidity provided by solid dielectrics 13, 14, conventional VIG 10 can have issues with maintaining a constant gap between striplines 11, 12 during operation. To solve the problem of structural rigidity during operation of the unipolar VIG 1500, striplines 1511, 1512 are made of a thick metal material that is sufficient to provide the rigidity necessary to ensure striplines 1511, 1512 maintain a constant gap between the spiral windings formed by striplines 1511, 1512. Materials such as aluminum, copper, and brass can be utilized to construct striplines 1511, 1512, of sufficient thickness to maintain a constant gap between the spiral windings formed by striplines 1511, 1512. In some embodiments, the thickness of striplines 1511, 1512 can be approximately 0.02" to approximately 0.2" in order to maintain a constant gap between the spiral windings formed by striplines 1511, 1512. Several manufacturing methods can be utilized to form unipolar VIG 1500, including but not limited to direct metal laser sintering (DMLS), stereolithography (SLA) resin printing with electroless nickel plating, and wire electrical discharge machining (EDM). In a preferred embodiment, EDM manufacture can be utilized to form bipolar VIG 1500. FIG. 15B shows a top-down view of bipolar VIG 1500. It can be seen that the spirally wound striplines 1511, 1512 form layers of conductors 146 that have gaps that are configured to be filled with a fluid and/or vacuum dielectric 114. In contrast to the unipolar VIG 100, the bipolar VIG 1500 produces a differential voltage (e.g., a positive voltage from the first pair of striplines 1511A, 1512A, and a negative voltage from the second pair of striplines 1511B, 1512B). The unipolar VIG 100 can produce a positive voltage or a negative voltage and a ground, unlike the bipolar VIG 1500. The benefit of being able to apply a differential voltage with the bipolar VIG 1500 is improved functionality when a balanced output voltage is required by an apparatus. For example, the bipolar VIG 1500 is able to provide a balanced output voltage to an apparatus such as an antenna used for pulse transmission. Another advantage of the bipolar VIG 1500 over the unipolar VIG 100 is a higher potential output efficiency, and a higher total output voltage as compared to the unipolar VIG 100. The other benefit with the bipolar VIG is the ability to use a single shorting switch to allow for the synchronous discharge of both the first pair of striplines 1511A, 1512A and the second pair of striplines 1511B, 1512B. If two separate VIGs were used, jitter between two separate shorting switches would reduce the output voltage and output voltage efficiency as compared to the bipolar VIG 1500 design.

Figure 16A:
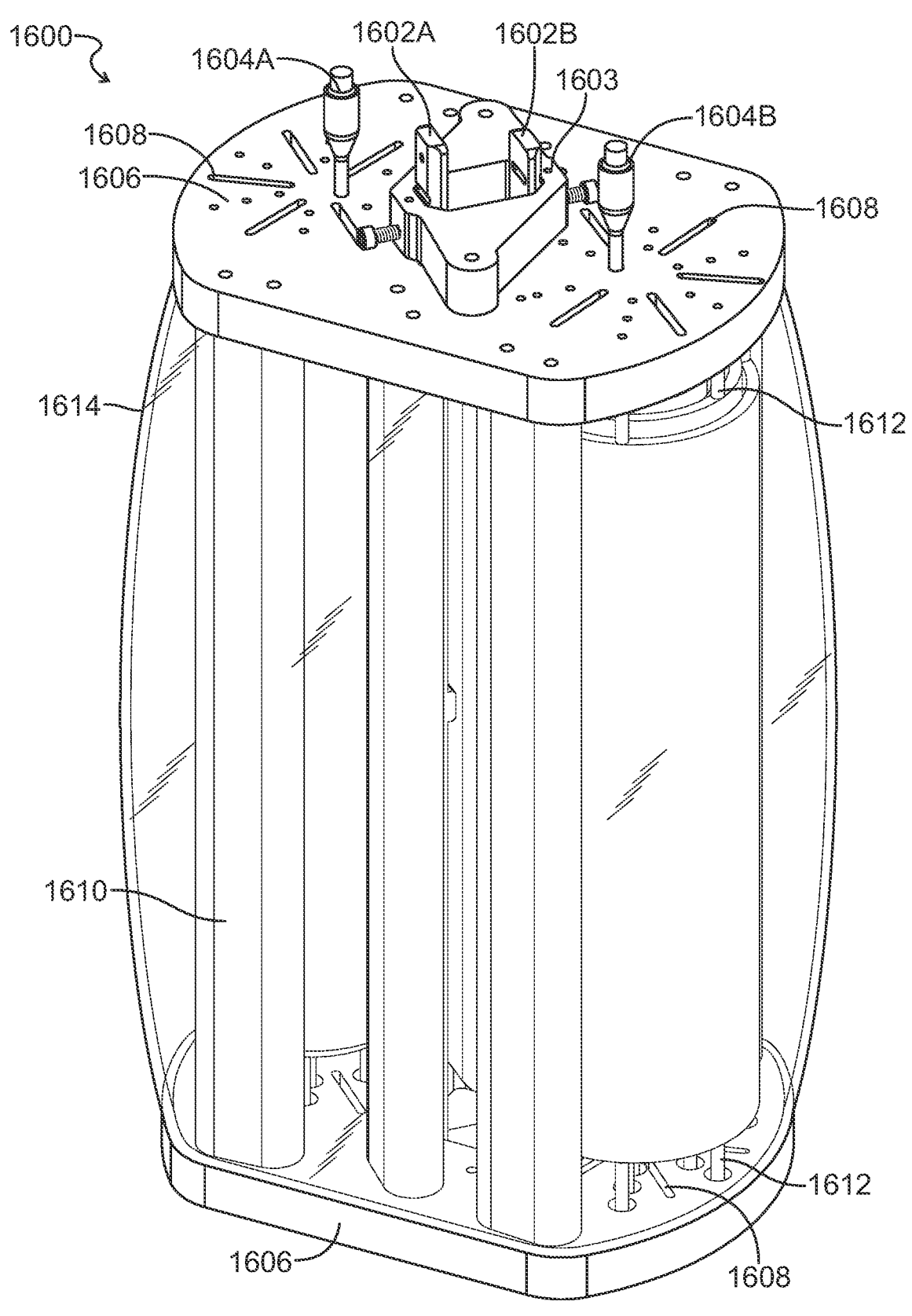
FIG. 16A depicts a side-profile view of an improved bipolar VIG and casing, according to aspects of the present disclosure.
Figure 16B:
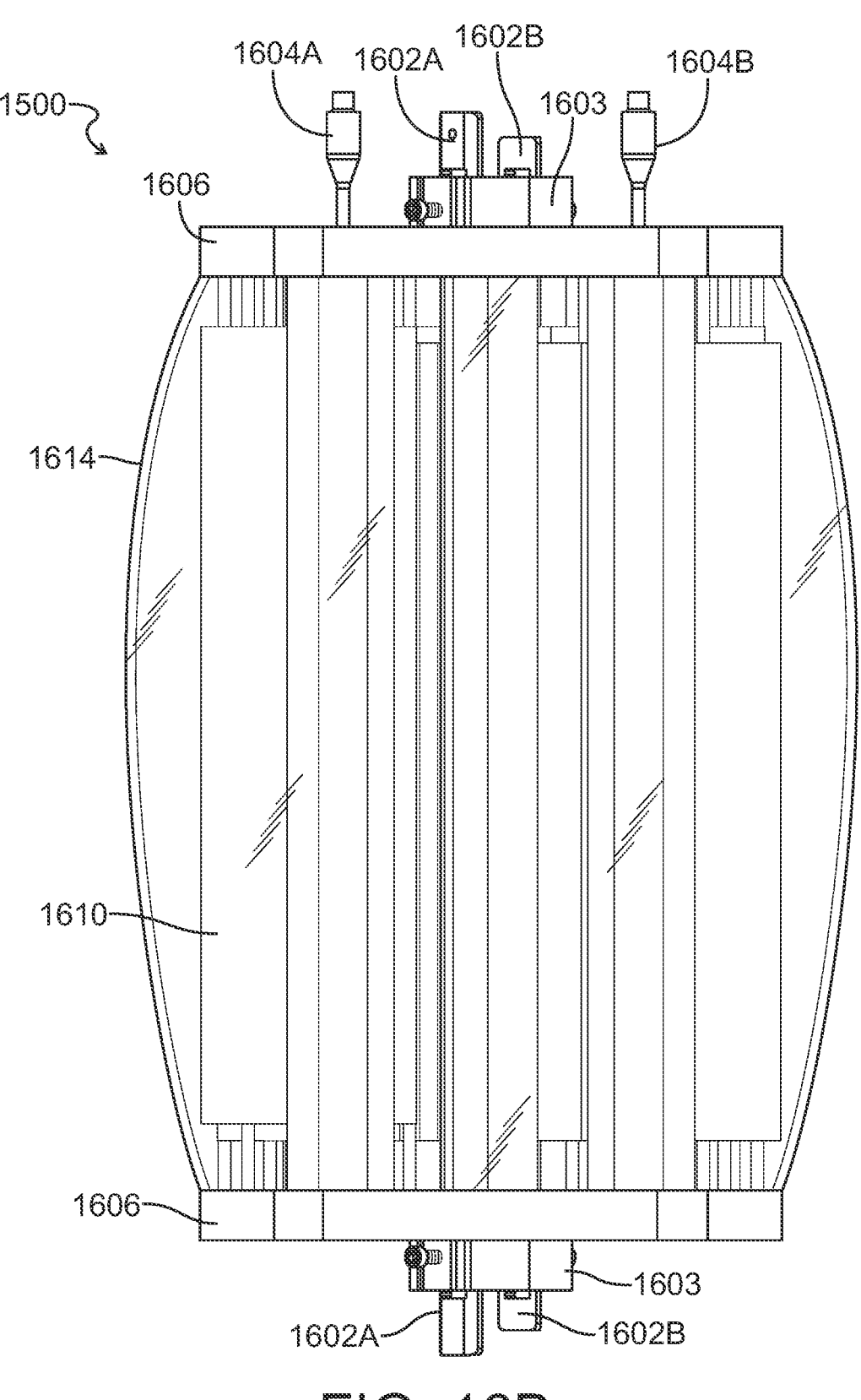
FIG. 16B depicts an isometric view of an improved bipolar VIG and casing, according to aspects of the present disclosure.
Figure 16C:
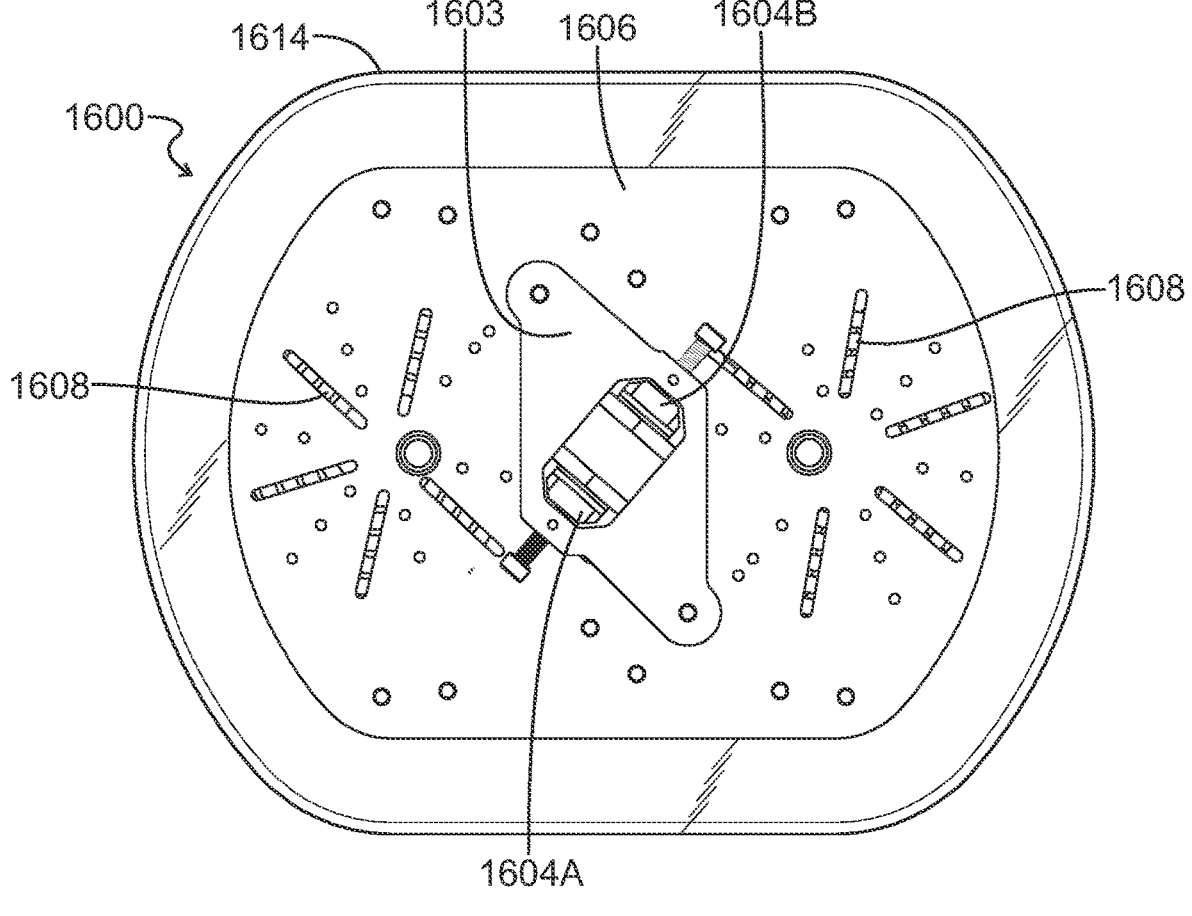
FIG. 16C depicts a top-down view of an improved bipolar VIG and casing, according to aspects of the present disclosure.

FIGS. 16A-16C depict a bipolar VIG casing 1600. More specifically, FIG. 16A is an isometric view of bipolar VIG casing 1600, FIG. 16B is a side profile view of bipolar casing 1600, and FIG. 16C is a bottom profile view of bipolar casing 1600. As shown in FIG. 16A, the bipolar VIG casing 1600 can have input charging terminals 1602A, 1602B, which collectively form a clamping structure 1603 which run along the entire height of bipolar VIG casing 1600, as best seen in FIG. 16B. The input charging terminals 1602A, 1602B are configured to connect to the input charging plates 1502 to provide an input voltage to the bipolar VIG 1500 while the bipolar VIG 1500 is within the bipolar VIG casing 1600. Clamping structure 1603 is configured to stabilize the striplines 1511, 1512 of the bipolar VIG 1500 during operation to avoid accidental discharge between the striplines 1511, 1512 and to maintain the constant gap between the striplines 1511, 1512. The clamping structure 1603 can also act as the shorting switch that initiates the high voltage output of bipolar VIG 1500. The bipolar VIG casing 1600 can also include a first high voltage output terminal 1604A and a second high voltage output terminal 1604B. The first high voltage output terminal 1604A can be connected to the inner (high voltage) end 1515A of the first pair of striplines 1511A, 1512A and the second high voltage output terminal 1604B can be connected to the inner (high voltage) end 1515B of the second pair of striplines 1511B, 1512B. One of first high voltage output terminal 1604A and second high voltage output terminal 1604B can output a positive voltage, while the other high voltage output terminal can output a negative voltage, as previously described with respect to bipolar VIG 1500 in the description of FIGS. 15A-15C. The bipolar VIG casing 1600 can also include support plates 1606 on either end of the bipolar VIG 1500 that are connected by support columns 1610. Support plates 1606 and support columns 1610 can keep bipolar VIG 1500 fastened and immobile and prevent undesirable movement during operation of the bipolar VIG 1500. Columns 1610 can be fastened to the support plates 1606 using fasteners known in the art, including but not limited to screws, bolts, etc. In some embodiments, the bipolar VIG casing 1600 can include a plurality of slots 1608 that can be disposed in either or both of support plates 1606, as best seen in FIG. 16C. The slots 1608 can be configured to facilitate the flow of a liquid dielectric 114 when a liquid dielectric is utilized with bipolar VIG 1500. That is, bipolar VIG casing 1600 and bipolar VIG 1500 can be placed into a container of dielectric liquid 114 when in use and the slots 1608 can allow the liquid dielectric 114 to rapidly flow through the bipolar VIG 1600, which can facilitate the ability of the dielectric to rapidly self-heal when an unwanted discharge occurs. When a gas dielectric or vacuum dielectric 114 is utilized, slots 1608 may not be present within bipolar VIG casing 1600. Rather, bipolar VIG casing 1600 can include a hermetic chamber 1614 that completely encompasses bipolar VIG 1500 and provides a hermetically sealed chamber that can contain gas dielectric 114 within the gaps of the striplines 1511, 1512 of bipolar VIG 1500. Alternatively, when a vacuum dielectric 114 is used, the hermetic chamber 1614 allows the vacuum dielectric 114 to be maintained within bipolar VIG 1500. While the striplines of unipolar VIG 100 can be constructed of different widths in order to discourage accidental discharge between the striplines, the striplines of bipolar VIG 1500 can be constructed with the same widths. Instead of varying the width, the bipolar VIG 1500 can include standoffs 1612, as best seen in FIGS. 16A-16B which function to space apart the striplines 1511, 1512 from one another in order to discourage discharge between the striplines across the constant gap of the planar spiral configuration formed by the striplines 1511, 1512 (e.g., between the layers of conductors 146).

Figures 17A, 17B:
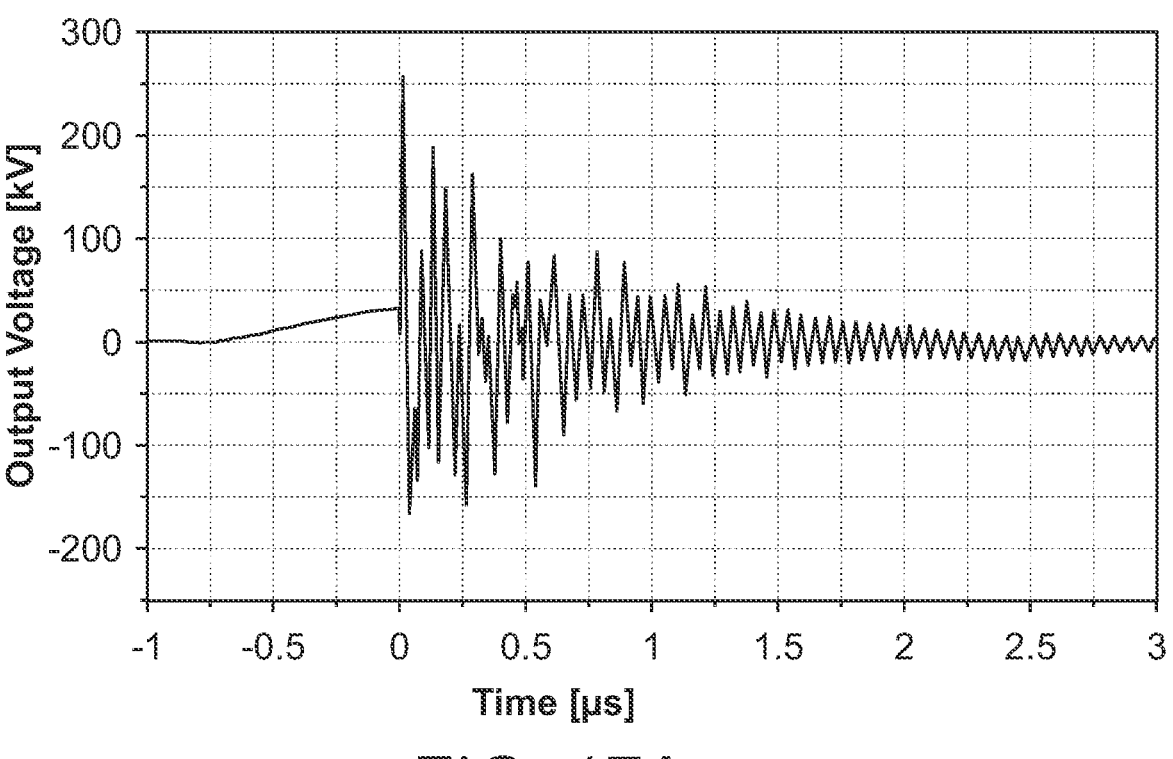
FIG. 17A is a table depicting output waveform parameters for an improved bipolar VIG, according to aspects of the present disclosure.
FIG. 17B depicts output voltage as a function of time for an improved bipolar VIG, according to aspects of the present disclosure.

FIG. 17A depicts output voltage as a function of time for bipolar VIG 1500. In the exemplary embodiment, the bipolar VIG 1500 achieved 253 kV, but in other embodiments, bipolar VIG 1500 can be configured to output between approximately 300 kV to approximately 1000 kV. The output voltage of bipolar VIG 1500 can be dependent on a plurality of factors, including but not limited to the selection of dielectric 114, the number of windings, materials, and widths of striplines 111, 112 of bipolar VIG 1500, the input voltage applied to bipolar VIG 1500, and the inner and outer diameters of the striplines 111, 112 of bipolar VIG 1500.

Depending on the type of dielectric used (e.g., if using DI water as dielectric 114), the various components used to charge bipolar VIG 1500, such as power supply 1202, capacitor 1204, gas discharge tube 1206, air-core inductor 1208, and gas discharge tube 1210 can influence the output voltage of bipolar VIG 1500 by influencing the predetermined input voltage that VIG 1500 is charged to.

FIG. 17B is a table depicting output waveform parameters for bipolar VIG 1500, according to aspects of the present disclosure. The example bipolar VIG 1500 can deliver an output voltage of 253 kV from an input voltage of 31.9 kV. The efficiency of bipolar VIG 100 in the exemplary embodiment was approximately 72%. The measured transit frequency and resonant frequency, $f_t$ and $f_r$, respectively, were measured to be 6.5 megahertz and 18.5 megahertz. It should be noted that the parameters shown in FIG. 17B are merely exemplary, and can be varied depending on the plurality of factors mentioned above.

Figure 18:
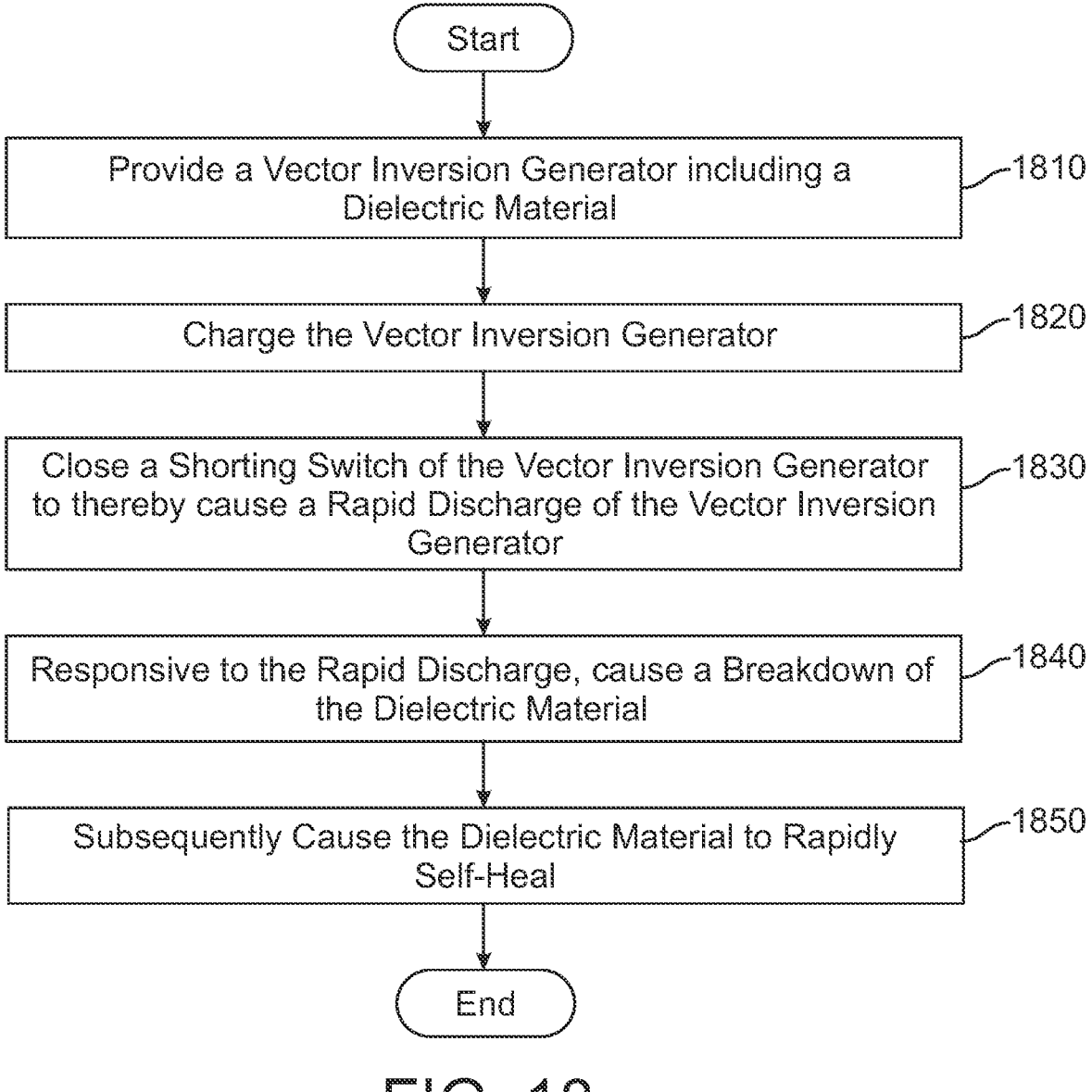
FIG. 18 is a flowchart demonstrating an exemplary method for operating an improved VIG, according to aspects of the present disclosure.

FIG. 18 is a flowchart demonstrating an exemplary method of generating high voltage pulses. The method of FIG. 18 can be implemented using any of the previously mentioned VIG devices, including unipolar VIG 100 (both with and without casing 200), and bipolar VIG 1500 (both with and without casing 1600). In step 1810, the method can include providing a unipolar VIG 100. Unipolar VIG 100 can include at least two striplines 111, 112 of a conductive material that are arranged in a planar spiral configuration. Each of the at least two striplines can include a thickness sufficient to maintain at a constant gap between respective layers of the planar spiral configuration formed by the at least two striplines 111, 112. The at least two striplines can be selectively coupled to a shorting switch 20. The vector inversion generator can include a dielectric material 114 filling the constant gap defined by the at least two striplines 111, 112. The vector inversion generator can include a casing 200 configured to encapsulate the vector inversion generator.

The bipolar VIG 1500 can include a first pair of striplines 1511A, 1512A and a second pair of striplines 1511B, 1512B. The first and second pair of striplines 1511, 1512 can be constructed of a conductive material arranged in a planar spiral configuration, and be configured to maintain a constant gap between respective layers of the planar spiral configuration formed by the respective pair of striplines. The first and second pair of striplines 1511, 1512 can include inner ends 1515, 1516 and a charging plate 1502 where the striplines of the first pair of striplines and the second pair of striplines are joined. The inner ends 1515, 1516 can be configured to output a high voltage, and input charging plates 1502 can be configured to provide a charging input to charge VIG 1500. The bipolar VIG 1500 can include a dielectric material 114 filling the constant gap defined by the first pair of striplines and the second pair of striplines. The first pair of striplines and the second pair of striplines can be connected at their respective outer ends to form the charging plate 1502. In some embodiments, one of first pair or the second pair of striplines can be configured to output a positive current from the output end, and the respective other pair of striplines can be configured to output a negative current from the output end. The bipolar VIG 1500 can include a bipolar VIG casing 1600 configured to encapsulate the bipolar VIG 1500. The casing can include first and second input charging terminals 1602A, 1602B for charging the bipolar VIG 1500. The first and second input charging terminals 1602A, 1602B can be coupled to the charging plate 1502 of VIG 1500. The first and second input charging terminals 1602A, 1602B collectively can form a clamping structure 1603 configured to stabilize the bipolar VIG 1500 and discourage undesirable current discharge between the striplines. The clamping structure 1603 can also act as a shorting switch that is configured to activate a rapid discharge of the bipolar VIG 1500 after the bipolar VIG 1500 has been charged to a predetermined input voltage. The casing can include a first high voltage output terminal 1604A connected to the inner, high voltage end 1515A, 1516A of the first pair of striplines 1511A, 1512A and a second high voltage output terminal 1604B connected to the inner, high voltage end 1515B, 1516B of the second pair of striplines 1511B, 1512B. The casing can include support plates 1606 that surround the bipolar VIG 1500 which are connected by support columns 1610. The bipolar VIG casing 1600 can include standoffs 1612 for spacing the striplines of the first pair of striplines apart and for spacing the second pair of striplines apart in order to prevent undesirable current discharge between the pairs of striplines of the first pair of striplines and the striplines of the second pair of striplines. In some embodiments, the bipolar VIG casing 1600 includes one or more slots 1608 that facilitate the flow of a fluid dielectric through the bipolar VIG 1500. In some embodiments, the casing includes a hermetic chamber 1614 for sealing the bipolar VIG 1500 from the environment.

In step 1820, the method can include charging the vector inversion generator. In some examples, vector inversion generator can be charged in a similar manner as described with respect to FIGS. 12A-12B.

In step 1830, the method can include closing the shorting switch 20 to thereby cause a rapid discharge of the vector inversion generator. In step 1840, the method can include causing a breakdown of dielectric material 114. In step 1850, the method can include, subsequent to the breakdown, causing the dielectric material 114 to rapidly self-heal.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices, and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

The terms "about" and "approximately" shall generally mean an acceptable degree of error or variation for the quantity measured given the nature or precision of the measurements. Typical, exemplary degrees of error or variation are within 20 percent (%), preferably within 10%, more preferably within 5%, and still more preferably within 1% of a given value or range of values. Numerical quantities given in this description are approximate unless stated otherwise, meaning that the term "about" or "approximately" can be inferred when not expressly stated.

With reference to the use of the word(s) "comprise," "comprises," and "comprising" in the foregoing description and/or in the following claims, unless the context requires otherwise, those words are used on the basis and clear understanding that they are to be interpreted inclusively, rather than exclusively, and that each of those words is to be so interpreted in construing the foregoing description and/or the following claims.

The term "including" should be interpreted to mean "including but not limited to . . . " unless the context clearly indicate otherwise.

The term "consisting essentially of" means that, in addition to the recited elements, what is claimed may also contain other elements (steps, structures, ingredients, components, etc.) that do not adversely affect the operability of what is claimed for its intended purpose. Such addition of other elements that do not adversely affect the operability of what is claimed for its intended purpose would not constitute a material change in the basic and novel characteristics of what is claimed.

The term "adapted to" means designed or configured to accomplish the specified objective, not simply able to be made to accomplish the specified objective.

The term "capable of" means able to be made to accomplish the specified objective.

The terminology used herein is for the purpose of describing particular embodiments only and is not intended to be limiting. As used herein, the singular forms "a", "an" and "the" are intended to include the plural forms as well (i.e. "at least one"), unless the context clearly indicates otherwise.

The terms "first", "second", and the like are used herein to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present disclosure.

Terms such as "at least one of A and B" should be understood to mean "only A, only B, or both A and B." The same construction should be applied to longer list (e.g., "at least one of A, B, and C").

What is claimed is:

1. A vector inversion generator comprising:
at least two striplines of a conductive material arranged in a planar spiral configuration, each of the at least two striplines having a thickness sufficient to maintain a constant gap between respective layers of the planar spiral configuration formed by the at least two striplines; and
a fluid filling the constant gap defined by the at least two striplines, wherein the fluid is a dielectric.

2. The vector inversion generator of claim 1, wherein the fluid has a low viscosity.

3. The vector inversion generator of claim 2, wherein the fluid comprises deionized water and transformer oil.

4. The vector inversion generator of claim 2, wherein the fluid has a kinematic viscosity from $1.0*10^{-7}$ m²/s to $2.0*10^{-5}$ m²/s.

5. The vector inversion generator of claim 1, wherein the striplines are constructed of a material selected from aluminum, copper, brass, or combinations thereof.

6. The vector inversion generator of claim 1, wherein the vector inversion generator comprises an output efficiency of more than 60%.

7. The system of claim 1, wherein the constant gap is sufficiently filled with the liquid to heal a dielectric breakdown between the at least two striplines.

8. A system for generating pulses, comprising:
a vector inversion generator comprising:
at least two striplines of a conductive material arranged in a planar spiral configuration, each of the at least two striplines comprising a rigidity sufficient to maintain a constant gap between respective layers of the planar spiral configuration formed by the at least two striplines, and
a fluid filling the constant gap defined by the at least two striplines, wherein the fluid is a dielectric; and
a casing configured to encapsulate the vector inversion generator, the casing comprising a plurality of support plates configured to immobilize the vector inversion generator during charging and discharging of the vector inversion generator.

9. The system of claim 8, wherein the casing forms a hermetically sealed chamber encompassing the vector inversion generator.

10. The system of claim 9, wherein the fluid is a gas.

11. The system of claim 10, wherein the gas is selected from sulfur hexafluoride, nitrogen, air, ammonia, carbon dioxide, carbon monoxide, hydrogen sulfide, oxygen, chlorine, hydrogen, sulfur dioxide, nitrous oxide, 1,2-dicholorotetrafluoroethane, dichlorodifluoromethane, trifluoromethane, 1,1,1,3,3,3-hexafluoropropane, carbon tetrafluoride, hexafluoroethane, 1,1,1,2-tetrafluoroethane, perfluoropropane, octafluorocyclobutane, perfluorobutane, helium, neon, argon, or combinations thereof.

12. The system of claim 8, wherein the striplines are constructed of a material selected from aluminum, copper, brass, or combinations thereof.

13. The system of claim 8, wherein the vector inversion generator comprises an output efficiency of more than 60%.

14. A method of generating high voltage pulses, comprising:
providing a vector inversion generator and a casing configured to encapsulate the vector inversion generator, wherein the vector inversion generator comprises:
at least two striplines of a conductive material arranged in a planar spiral configuration, each of the at least two striplines comprising a thickness sufficient to maintain a constant gap between respective layers of the planar spiral configuration formed by the at least two striplines, the at least two striplines selectively coupled to a shorting switch, and
a fluid filling the constant gap defined by the at least two striplines, wherein the fluid is a dielectric;
charging the vector inversion generator;
closing the shorting switch thereby causing a rapid discharge of the vector inversion generator;
responsive to the rapid discharge, causing a breakdown of the fluid; and
subsequently causing the fluid to self-heal.

15. The method of claim 14, wherein the fluid has low viscosity.

16. The method of claim 15, wherein the fluid comprises deionized water and transformer oil.

17. The method of claim 14, wherein the casing is configured to hermetically seal the vector inversion generator.

18. The method of claim 17, wherein the fluid is a gas selected from sulfur hexafluoride, nitrogen, air, ammonia, carbon dioxide, carbon monoxide, hydrogen sulfide, oxygen, chlorine, hydrogen, sulfur dioxide, nitrous oxide, 1,2- dicholorotetrafluoroethane, dichlorodifluoromethane, trifluoromethane, 1,1,1,3,3,3-hexafluoropropane, carbon tetrafluoride, hexafluoroethane, 1,1,1,2-tetrafluoroethane, perfluoropropane, octafluorocyclobutane, perfluorobutane, helium, neon, argon, or combinations thereof.

19. A system for generating pulses, comprising:

a vector inversion generator comprising (1) at least two striplines of a conductive material arranged in a planar spiral configuration, each of the at least two striplines having a thickness sufficient to maintain a constant gap between respective layers of the planar spiral configuration formed by the at least two striplines, wherein the respective layers of the planar spiral configuration formed by the at least two striplines are separated by a fluid or vacuum and wherein the fluid is a dielectric, and (2) a shorting switch coupled to the at least two striplines for selectively shorting the at least two striplines to induce a discharge of a pulse from the vector inversion generator; and a casing for encapsulating the vector inversion generator.

20. The system of claim 19, wherein the casing forms a hermetically sealed chamber encompassing the vector inversion generator.

21. The system of claim 19, wherein the fluid is a liquid.

22. The system of claim 19, wherein the fluid is a gas.

23. The system of claim 19, wherein the fluid has a kinematic viscosity from $1.0*10^{-7}$ m$^2$/s to $2.0*10^{-5}$ m$^2$/s.

* * * * *